United States Patent
Masuoka et al.

(10) Patent No.: US 9,647,142 B2
(45) Date of Patent: May 9, 2017

(54) METHOD FOR PRODUCING SEMICONDUCTOR DEVICE AND SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

(21) Appl. No.: 15/228,046

(22) Filed: Aug. 4, 2016

(65) Prior Publication Data

US 2016/0343879 A1 Nov. 24, 2016

Related U.S. Application Data

(63) Continuation of application No. PCT/JP2014/065870, filed on Jun. 16, 2014.

(51) Int. Cl.
*H01L 21/8232* (2006.01)
*H01L 29/786* (2006.01)
(Continued)

(52) U.S. Cl.
CPC .. *H01L 29/78696* (2013.01); *H01L 29/42392* (2013.01); *H01L 29/66545* (2013.01);
(Continued)

(58) Field of Classification Search
CPC .................. H01L 21/823487; H01L 29/66272
(Continued)

(56) References Cited

U.S. PATENT DOCUMENTS 5,258,635 A 11/1993 Nitayama et al.
8,188,537 B2 5/2012 Masuoka et al.
(Continued)

FOREIGN PATENT DOCUMENTS

JP H0271556 A 3/1990
JP H02188966 A 7/1990
(Continued)

OTHER PUBLICATIONS

Wu C.C., et al., "High Performance 22/20nm FinFET CMOS Devices with Advanced High-K/Metal Gate Scheme", 2010.
(Continued)

*Primary Examiner* — George Fourson, III
(74) *Attorney, Agent, or Firm* — Brinks Gilson & Lione

(57) ABSTRACT

A method for producing a semiconductor device includes a first step of forming a fin-shaped semiconductor layer on a semiconductor substrate and forming a first insulating film; a second step of forming a pillar-shaped semiconductor layer and a first dummy gate; a third step of forming a second dummy gate on side walls of the first dummy gate and the pillar-shaped semiconductor layer; a fourth step of forming a fifth insulating film and a sixth insulating film around the second dummy gate; a fifth step of depositing a first interlayer insulating film, removing the second dummy gate and the first dummy gate, forming a gate insulating film around the pillar-shaped semiconductor layer, depositing metal, and performing etch back to form a gate electrode and a gate line; and a sixth step of forming a first diffusion layer in an upper portion of the pillar-shaped semiconductor layer.

6 Claims, 45 Drawing Sheets

(51) Int. Cl.
*H01L 29/78* (2006.01)
*H01L 29/423* (2006.01)
*H01L 29/66* (2006.01)
*H01L 21/8234* (2006.01)

(52) U.S. Cl.
CPC .. *H01L 29/66666* (2013.01); *H01L 29/66742* (2013.01); *H01L 29/78* (2013.01); *H01L 29/78642* (2013.01); H01L 21/823487 (2013.01); H01L 29/66272 (2013.01)

(58) Field of Classification Search
USPC .................................. 438/263; 257/212, 268
See application file for complete search history.

(56) References Cited

U.S. PATENT DOCUMENTS

| | | | | |
|---|---|---|---|---|
| 2013/0140627 A1* | 6/2013 | Masuoka | ............ | H01L 29/7827 257/329 |
| 2013/0153989 A1* | 6/2013 | Masuoka | .......... | H01L 29/66666 257/329 |
| 2013/0256788 A1 | 10/2013 | Kosuge | | |
| 2013/0307037 A1* | 11/2013 | Masuoka | .......... | H01L 29/66477 257/288 |
| 2014/0070326 A1* | 3/2014 | Masuoka | .............. | H01L 29/775 257/368 |
| 2014/0091403 A1* | 4/2014 | Masuoka | ............ | H01L 29/4238 257/413 |
| 2014/0131791 A1* | 5/2014 | Masuoka | .......... | H01L 29/66666 257/329 |
| 2015/0295057 A1* | 10/2015 | Masuoka | ........ | H01L 21/823487 257/329 |
| 2015/0303301 A1* | 10/2015 | Masuoka | ............ | H01L 29/7828 257/328 |
| 2016/0380116 A1* | 12/2016 | Masuoka | .......... | H01L 29/78696 438/268 |

FOREIGN PATENT DOCUMENTS

| | | |
|---|---|---|
| JP | H03145761 A | 6/1991 |
| JP | 2009182317 A | 8/2009 |
| JP | 2013206932 A | 10/2013 |
| WO | 2013171908 A1 | 11/2013 |
| WO | 2014024266 A1 | 2/2014 |
| WO | 2014057532 A1 | 4/2014 |

OTHER PUBLICATIONS

English language translation of International Preliminary Report on Patentability in corresponding International Application No. PCT/JP2014/065870, dated Dec. 22, 2016, 4 pages.

* cited by examiner

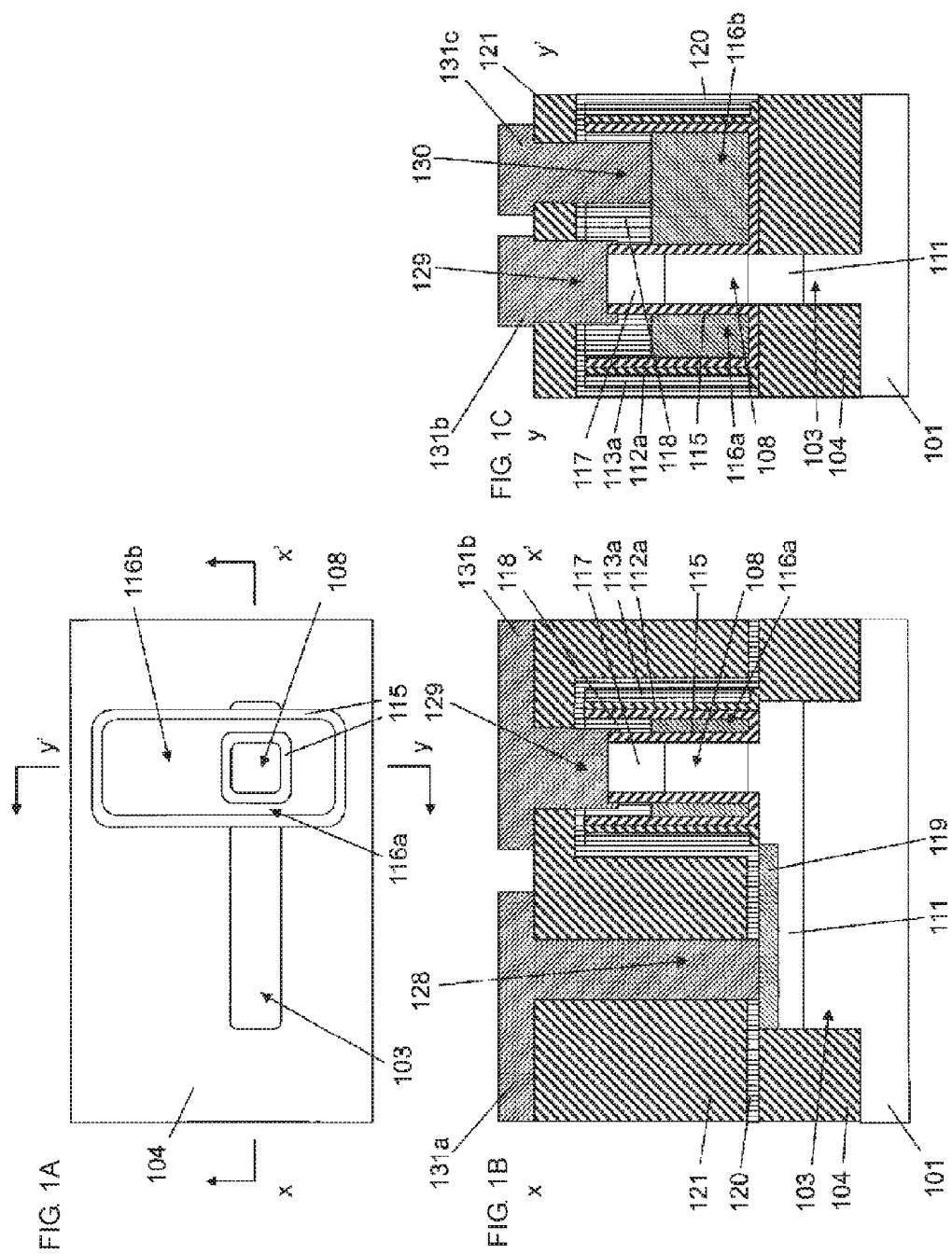

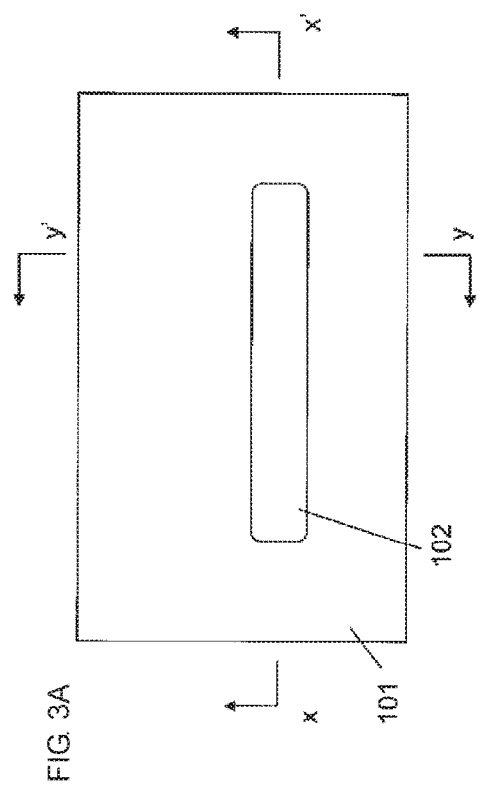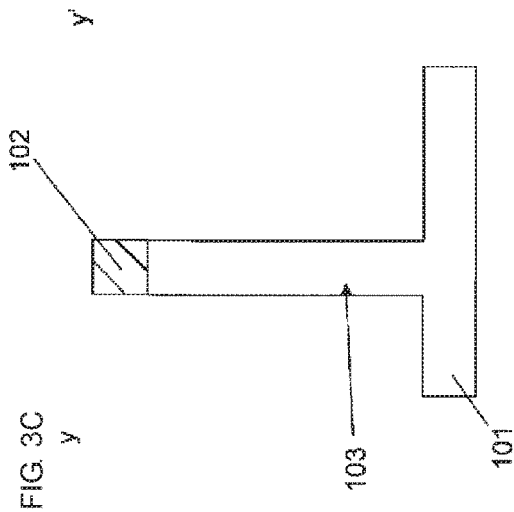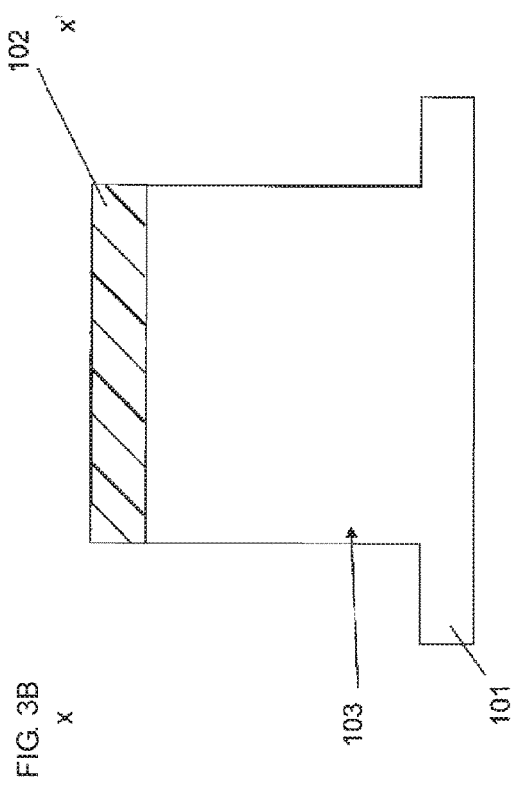

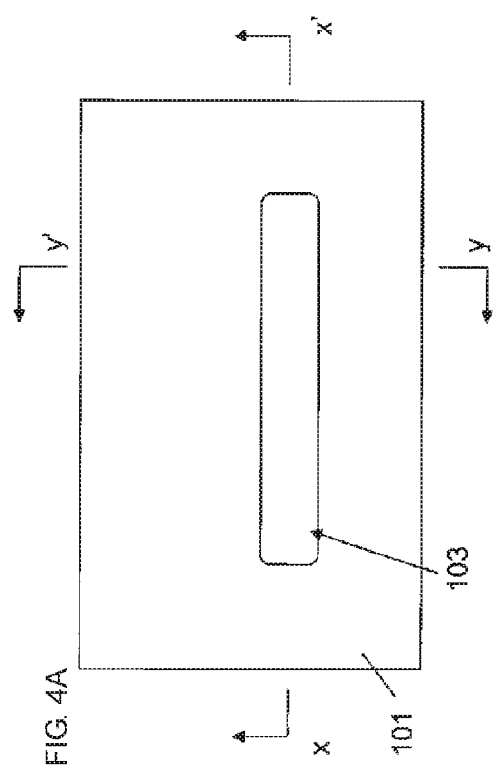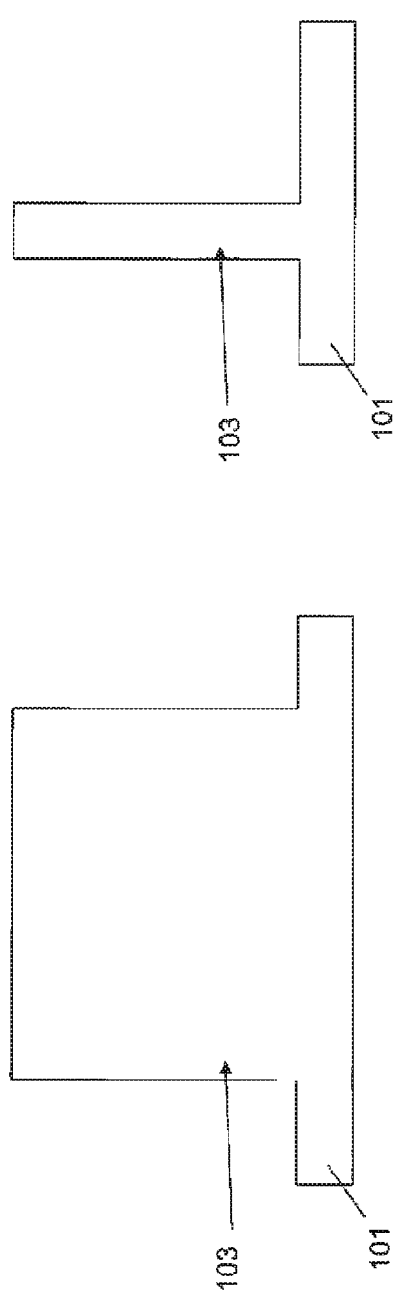

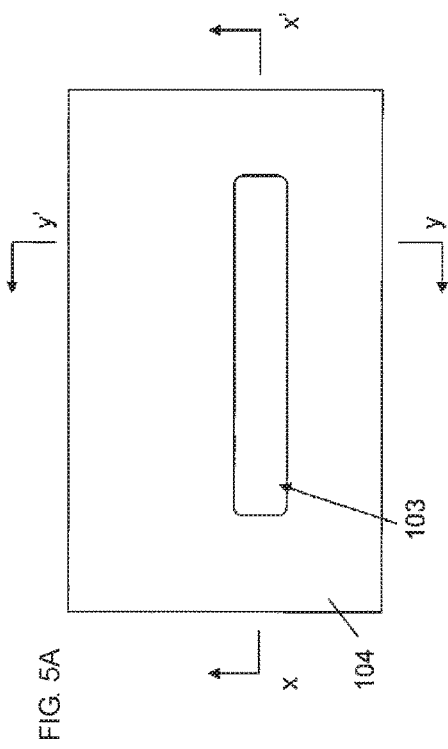
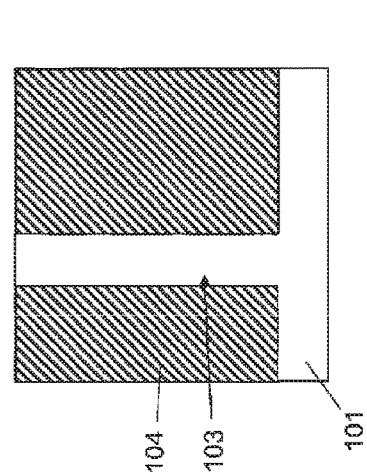
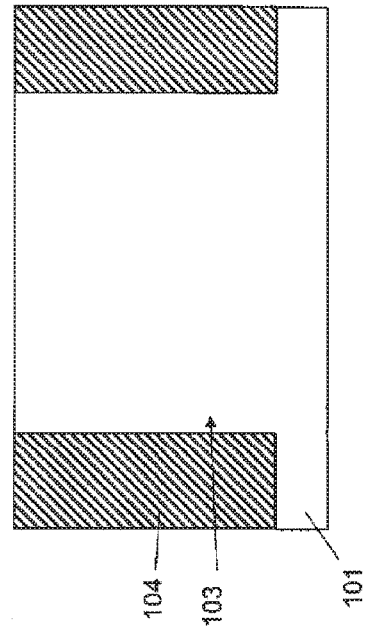
FIG. 5A
FIG. 5B
FIG. 5C

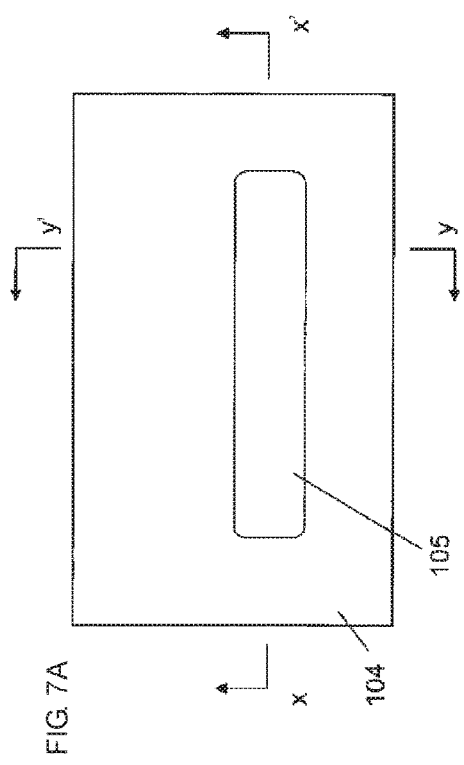
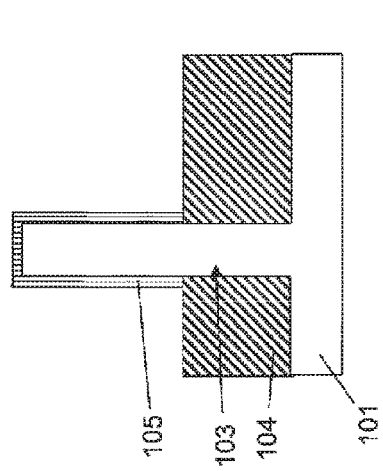
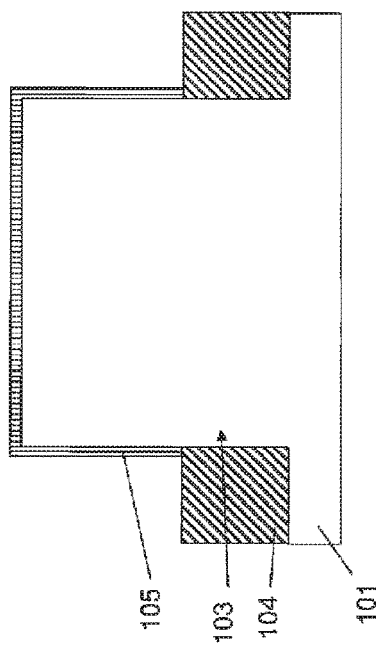

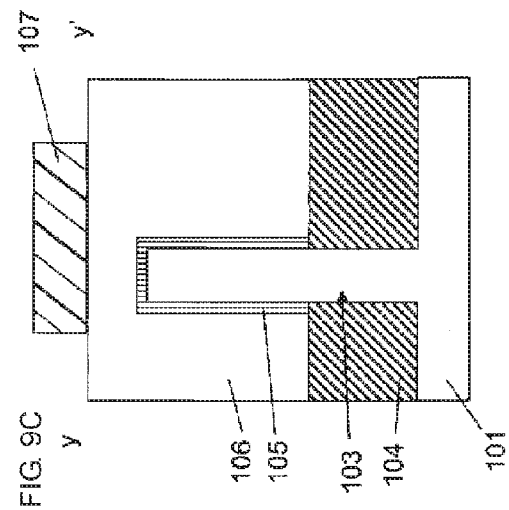
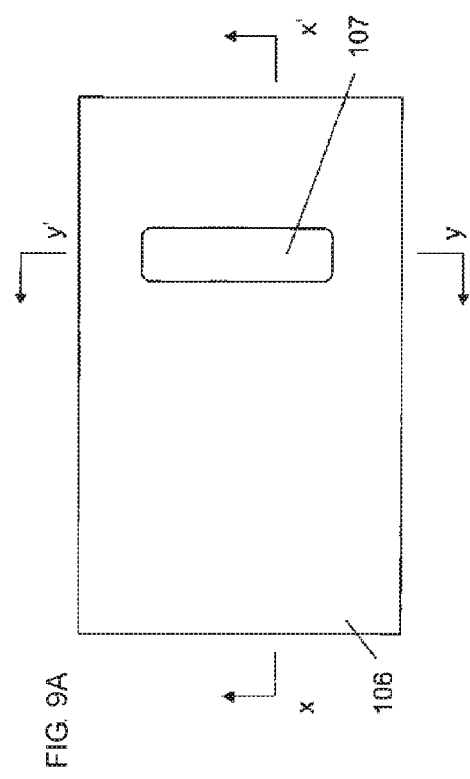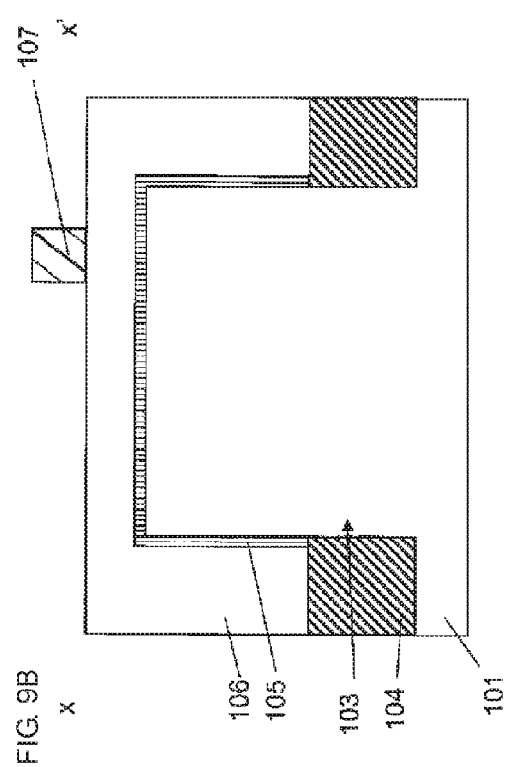

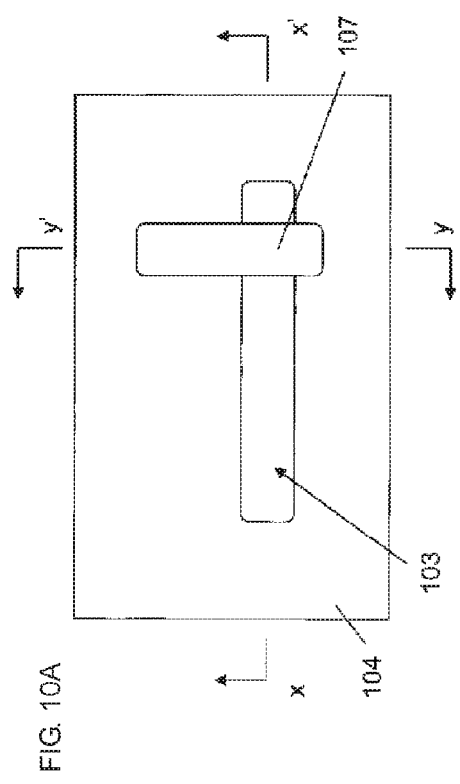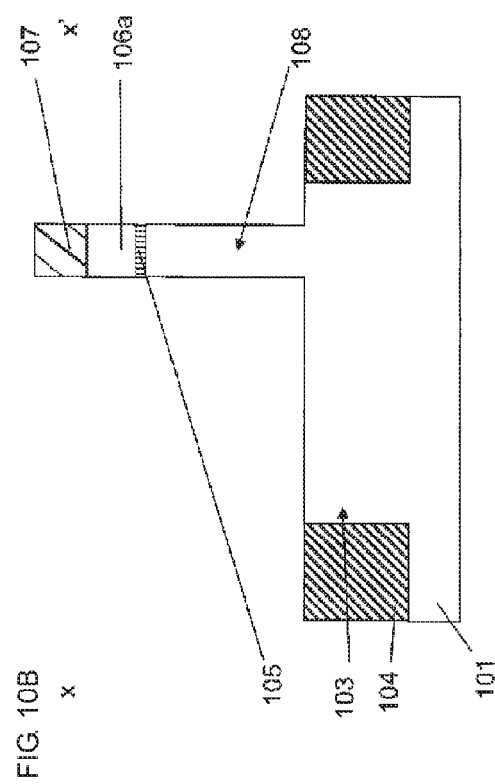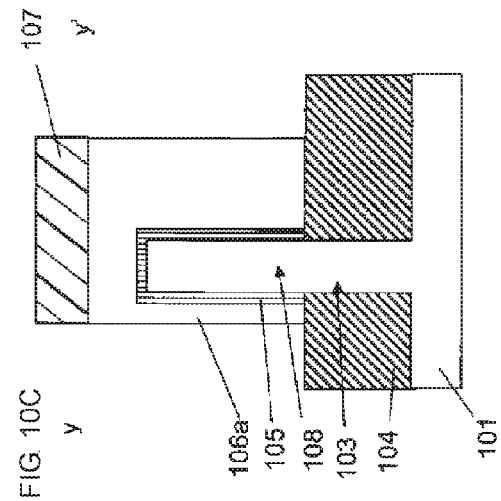

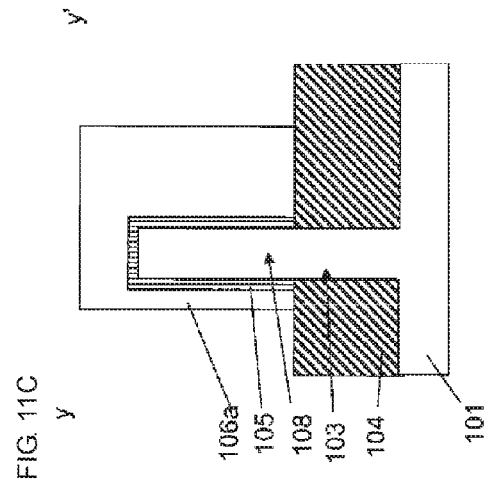
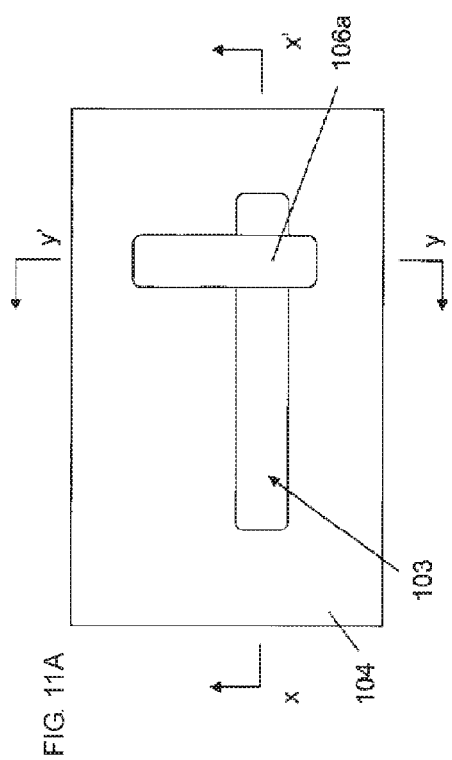
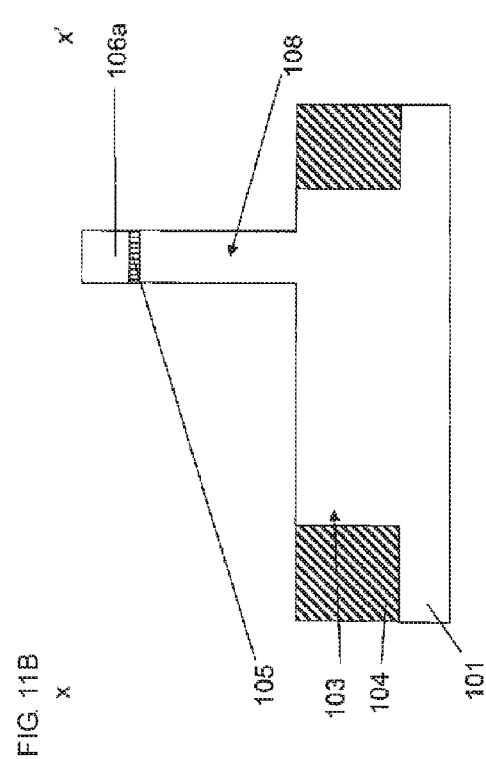

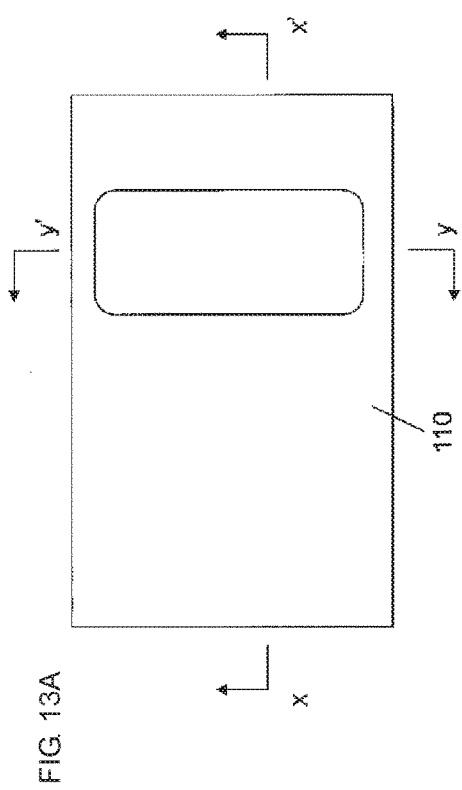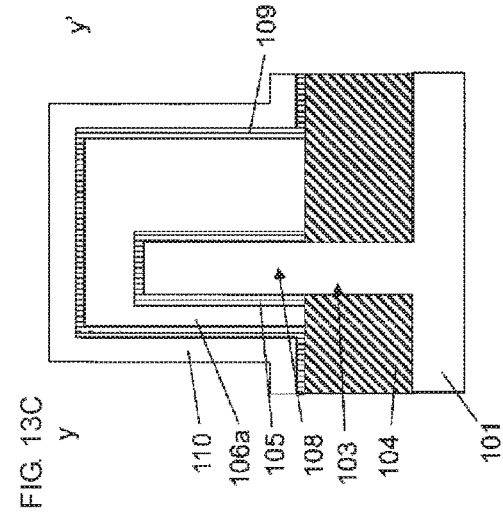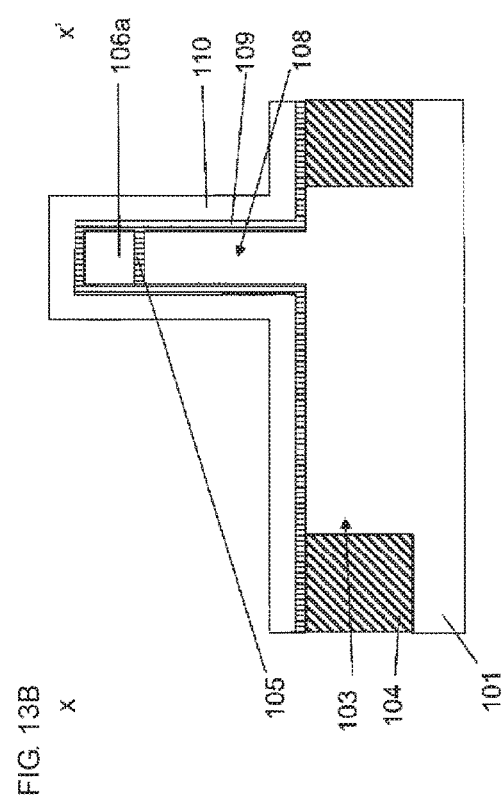

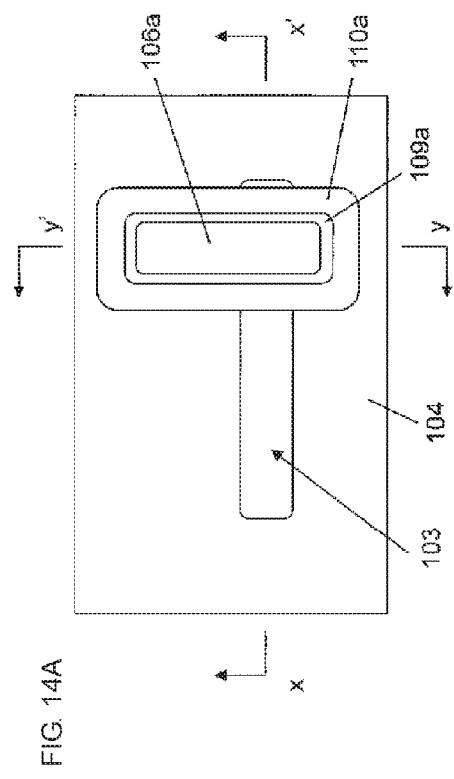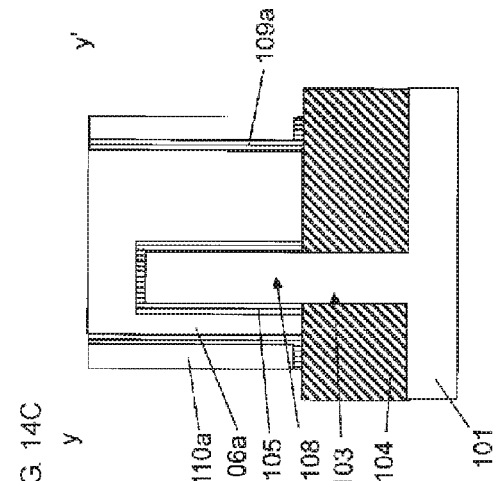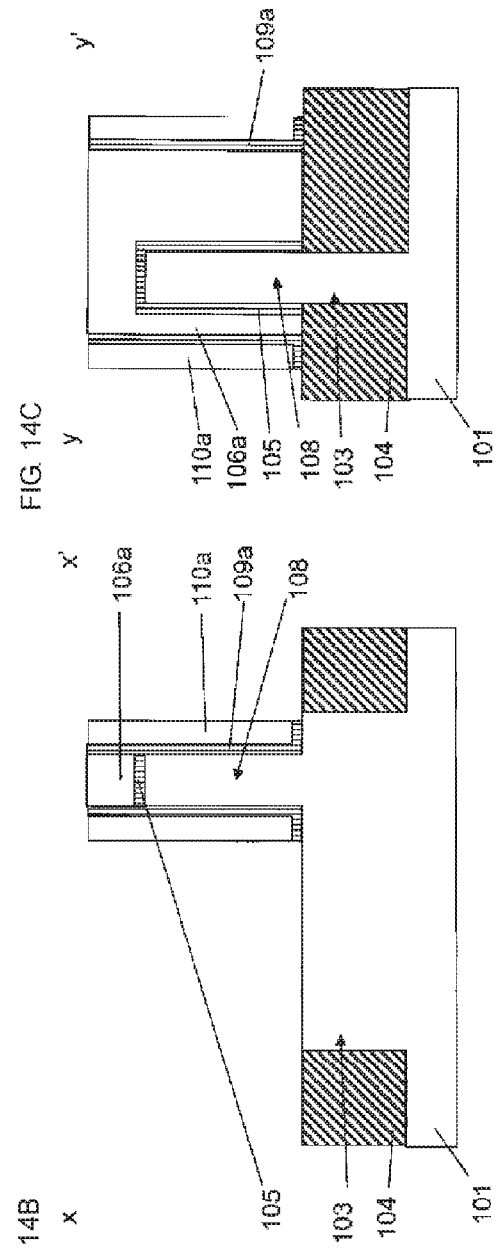

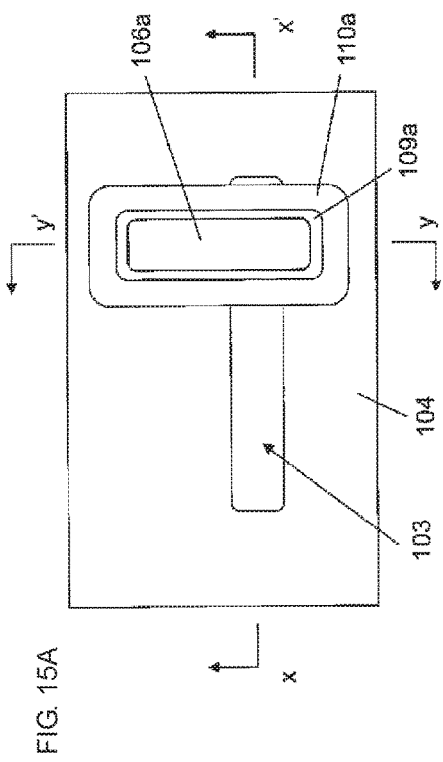
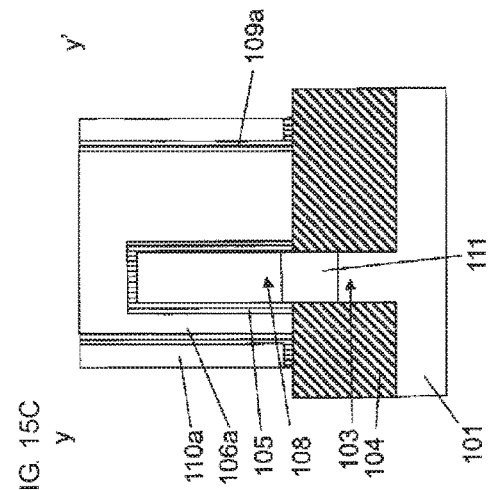
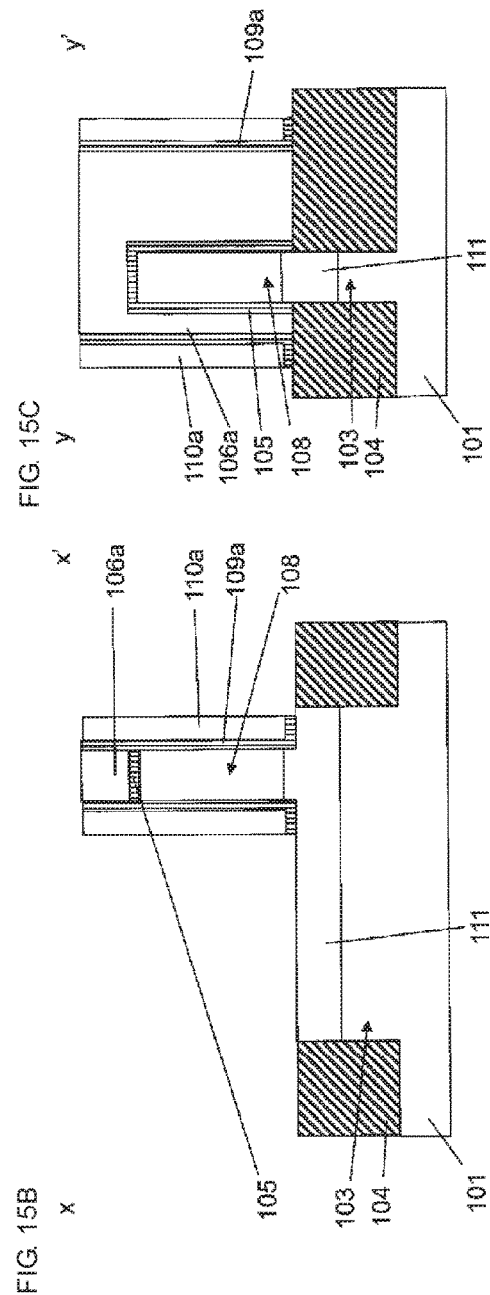

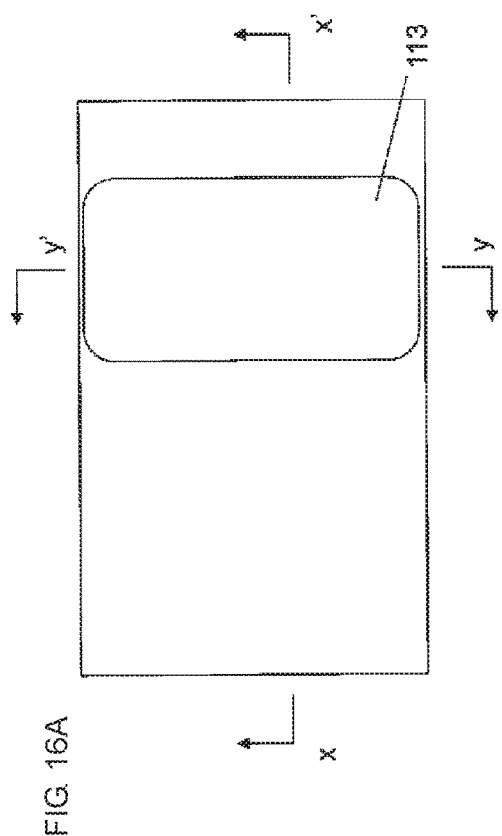
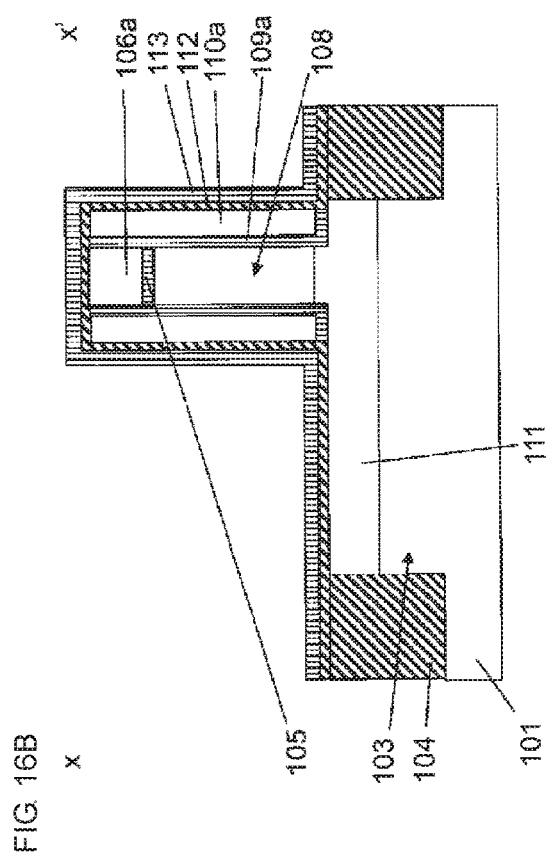
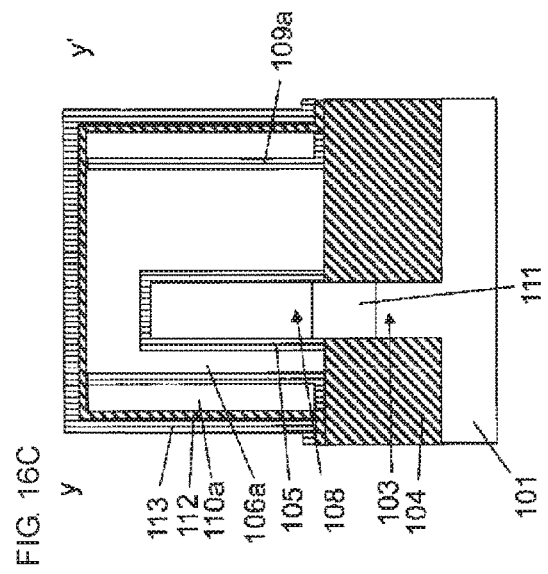
FIG. 16A
FIG. 16B
FIG. 16C

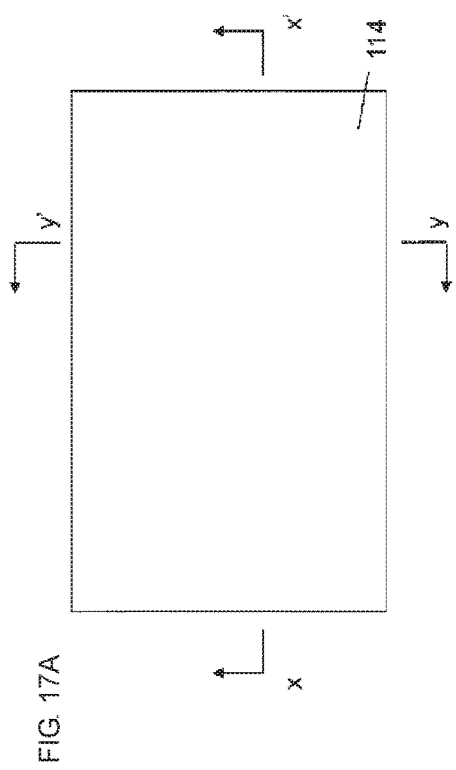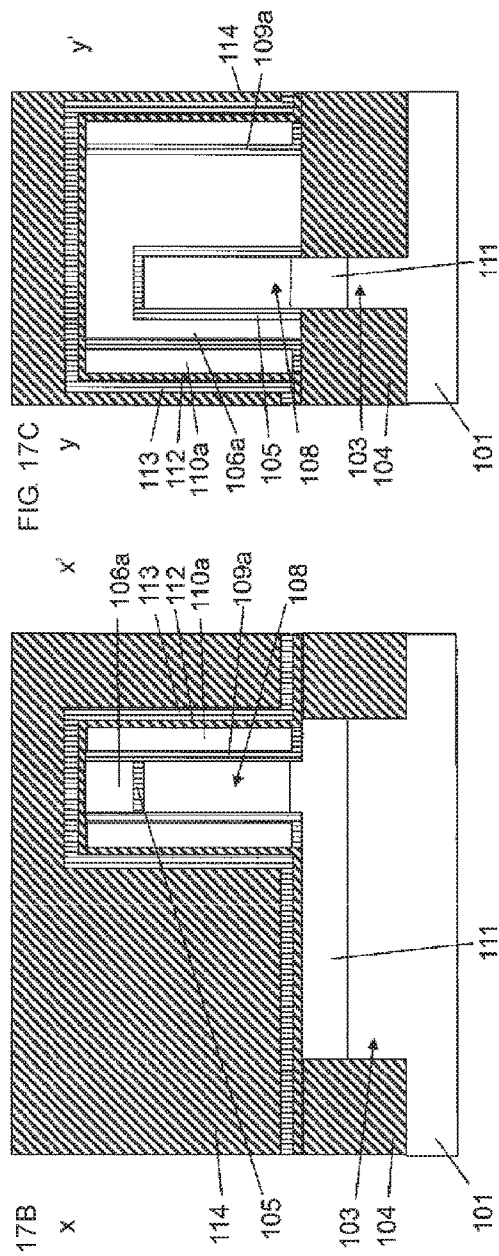

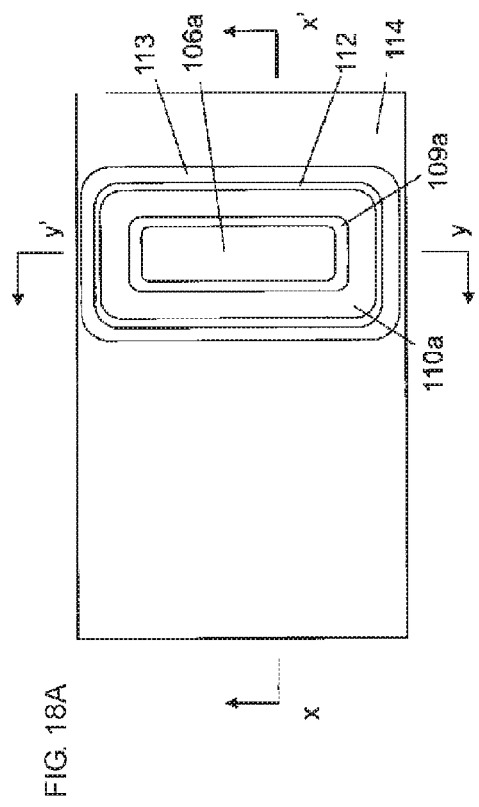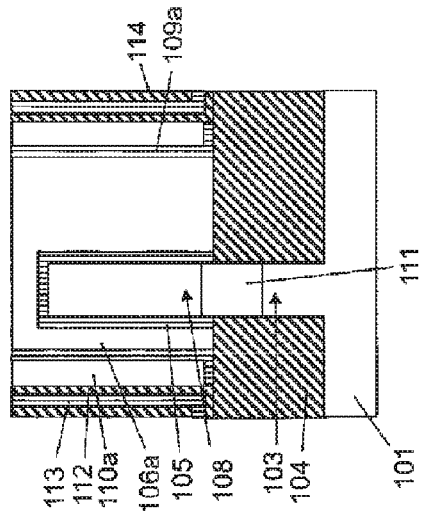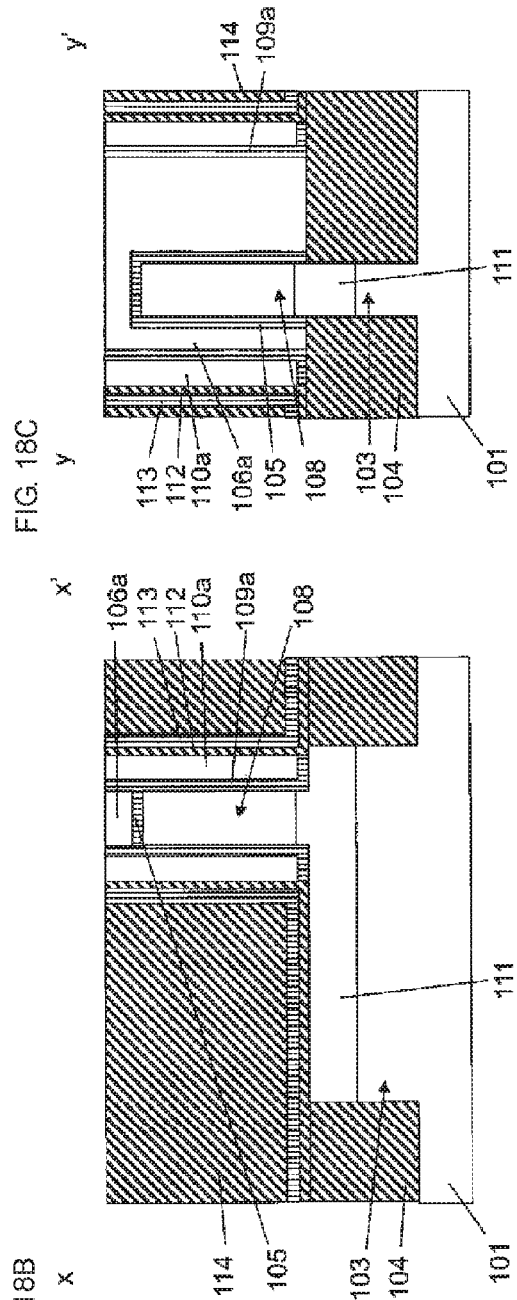

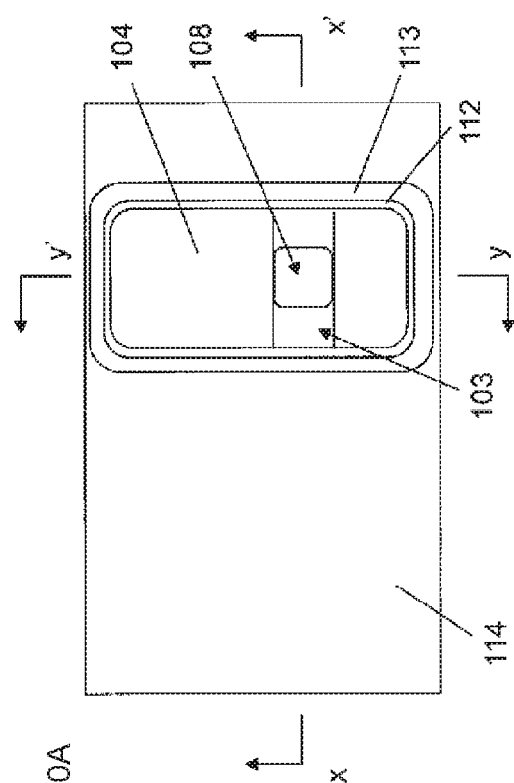
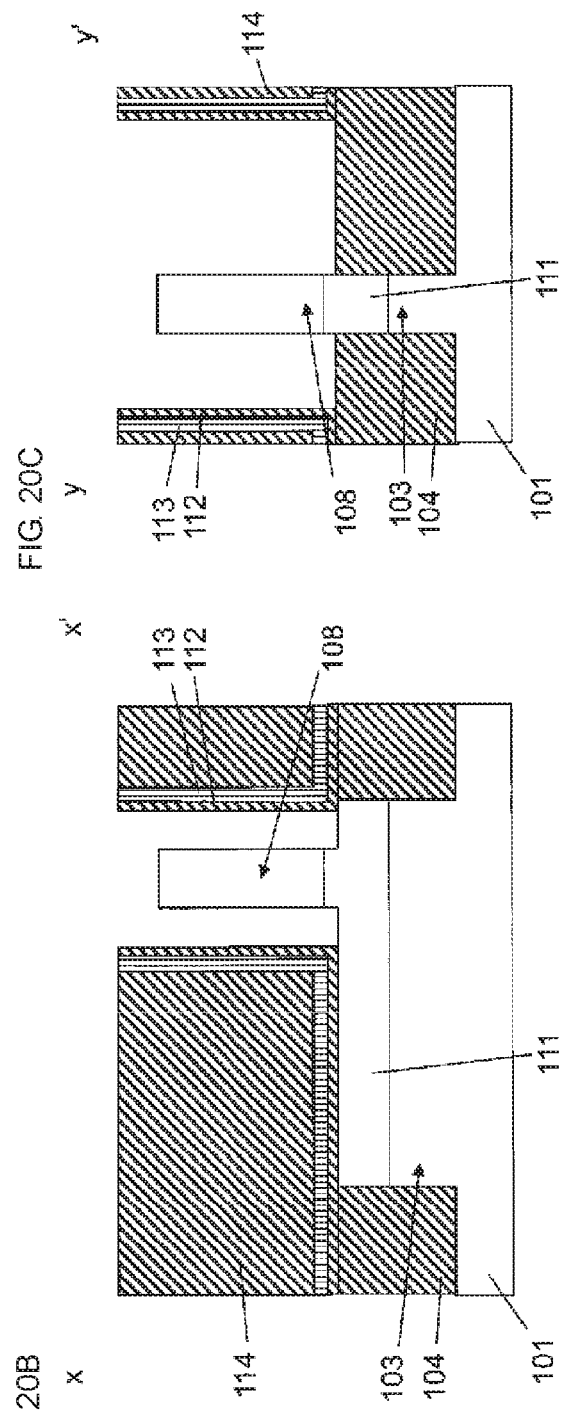
FIG. 20A
FIG. 20B
FIG. 20C

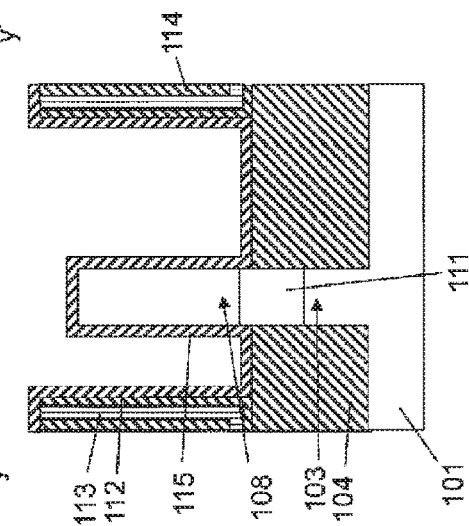
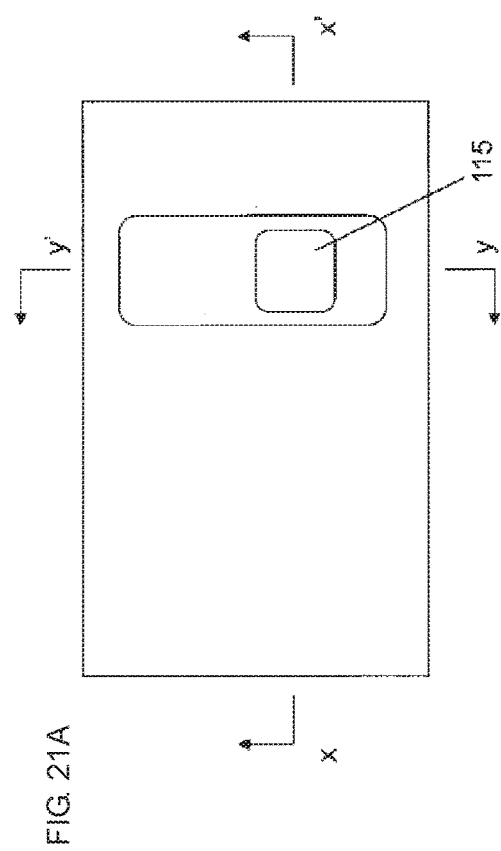
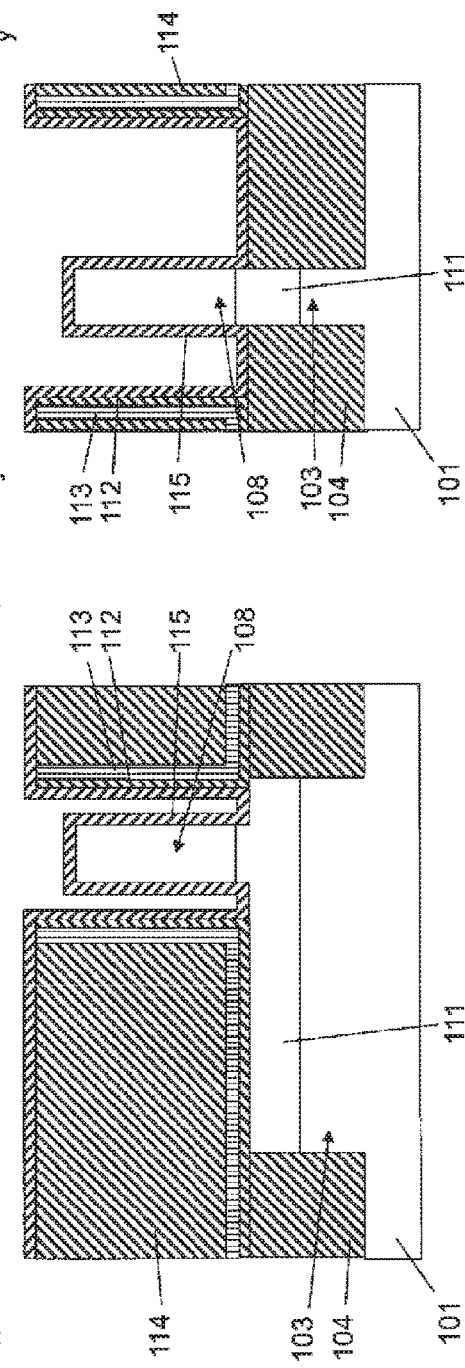

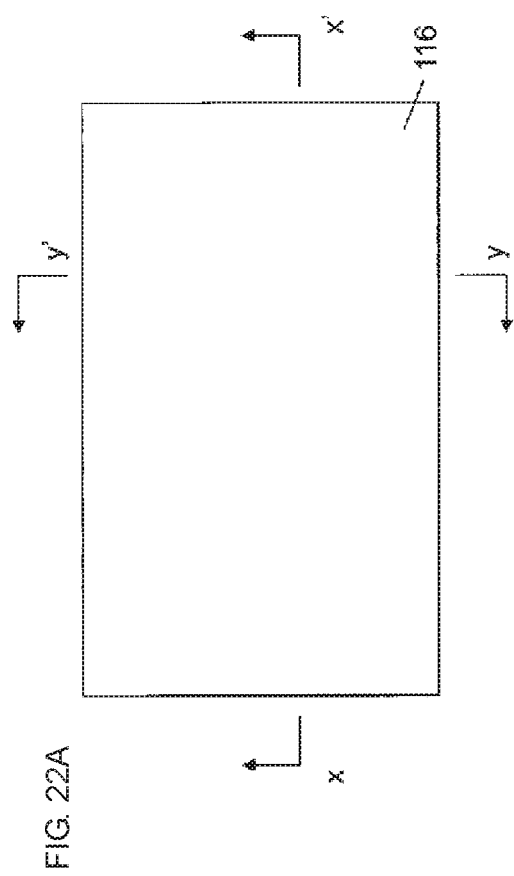
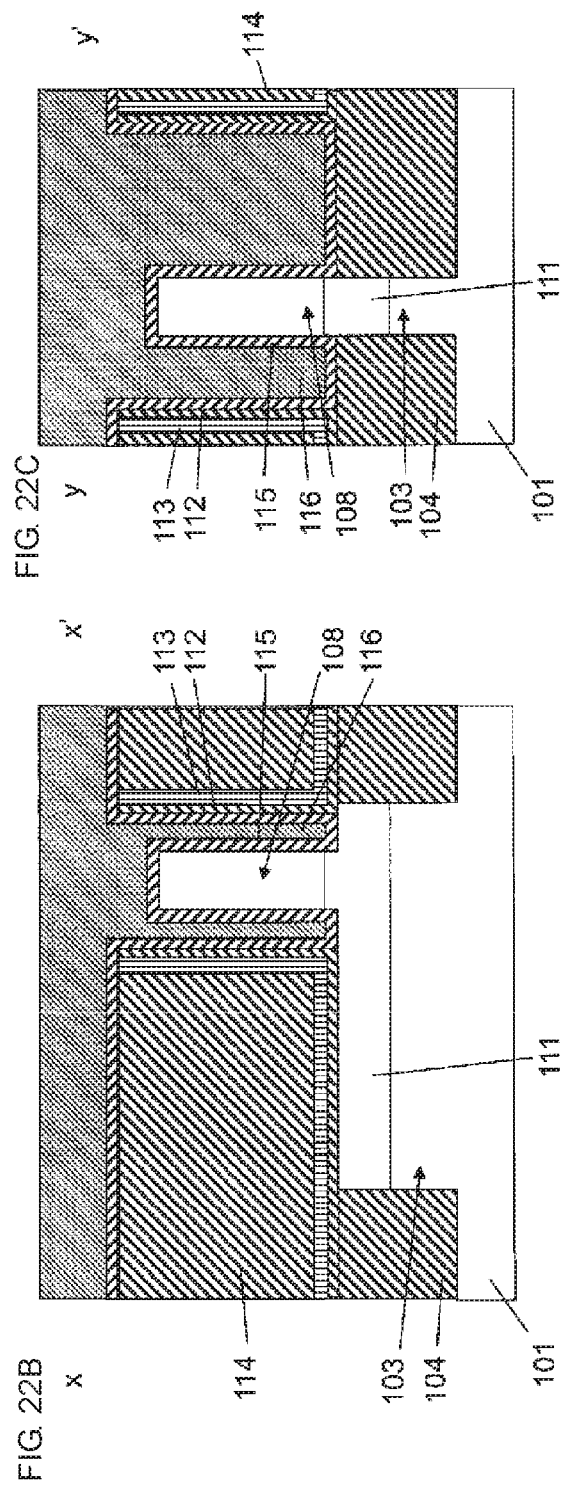
FIG. 22A
FIG. 22B
FIG. 22C

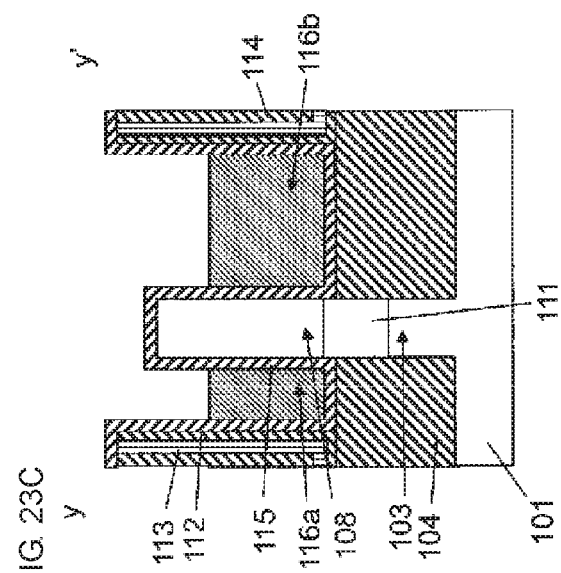
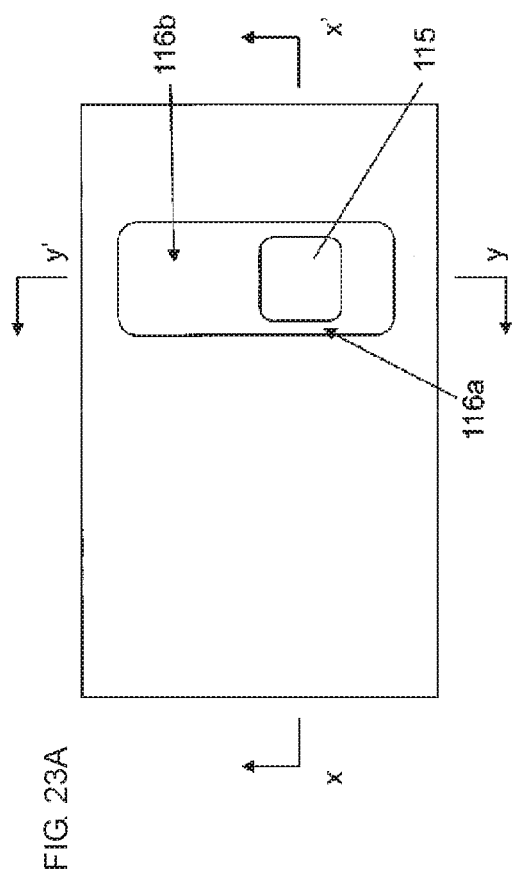
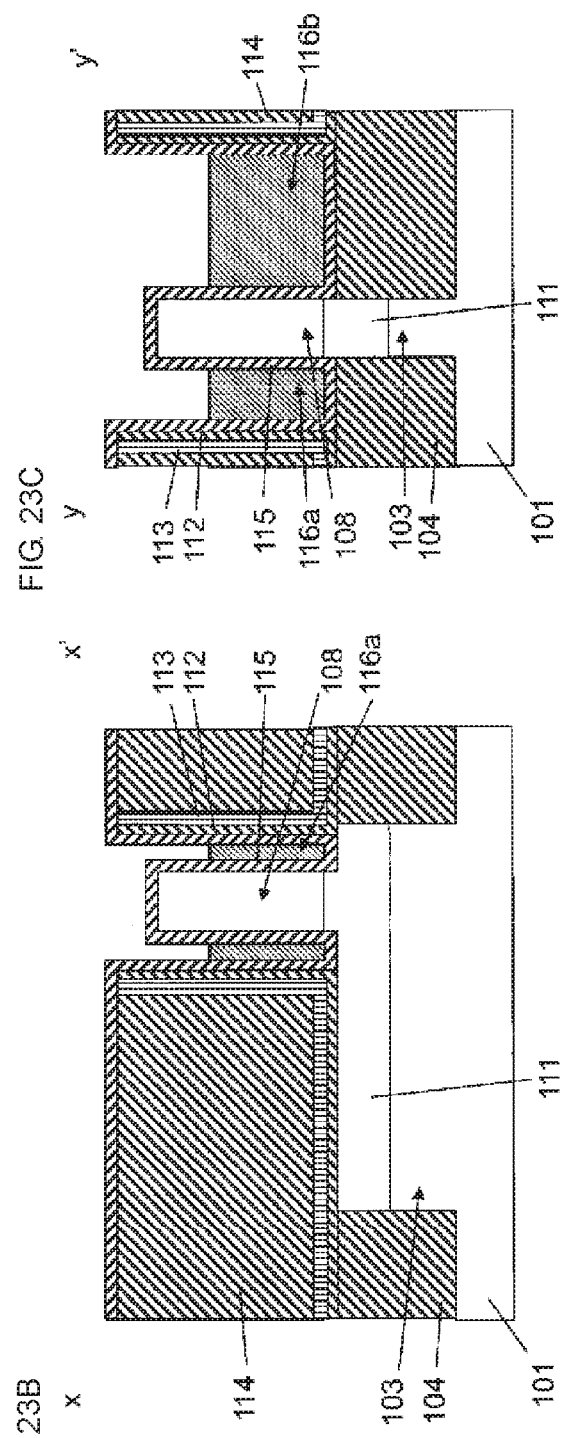

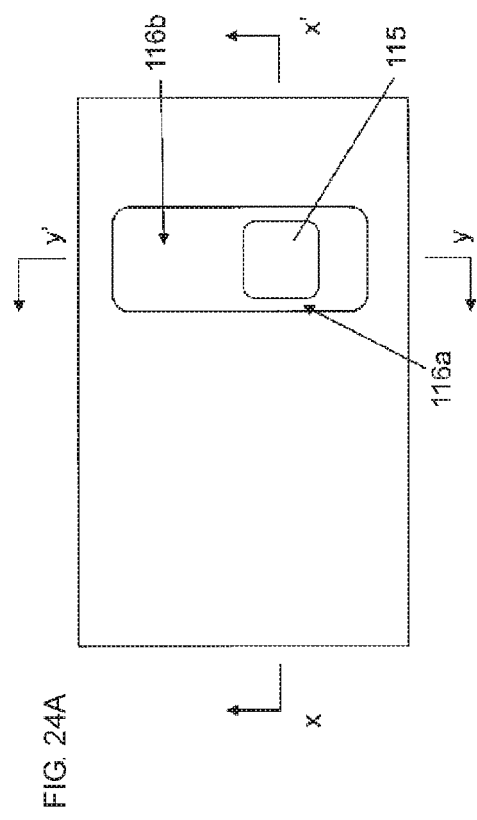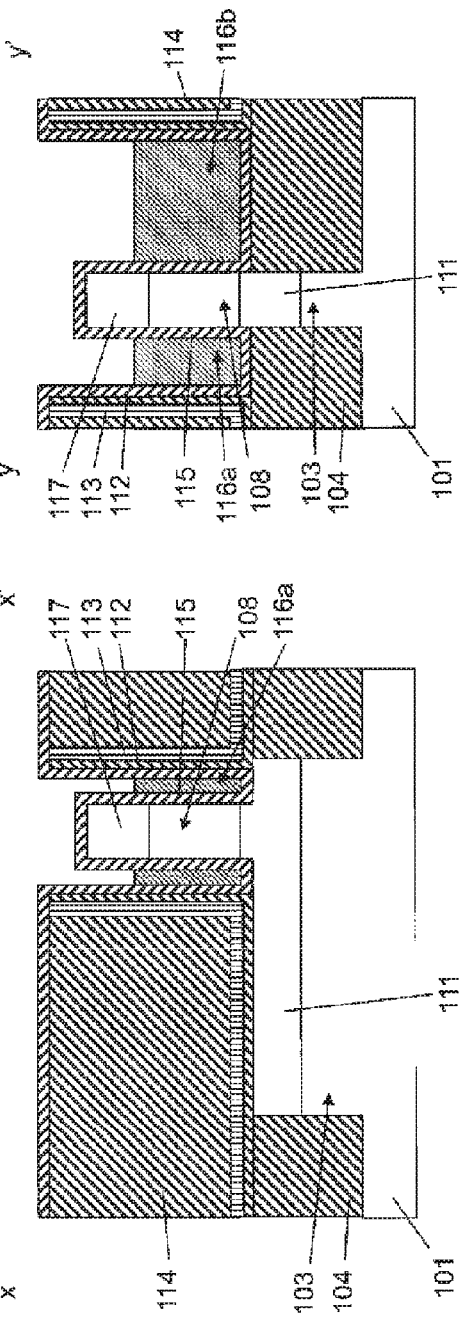

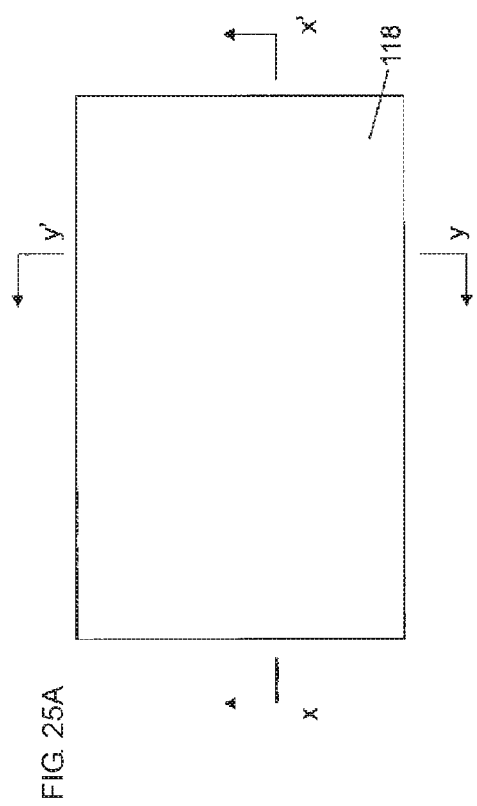
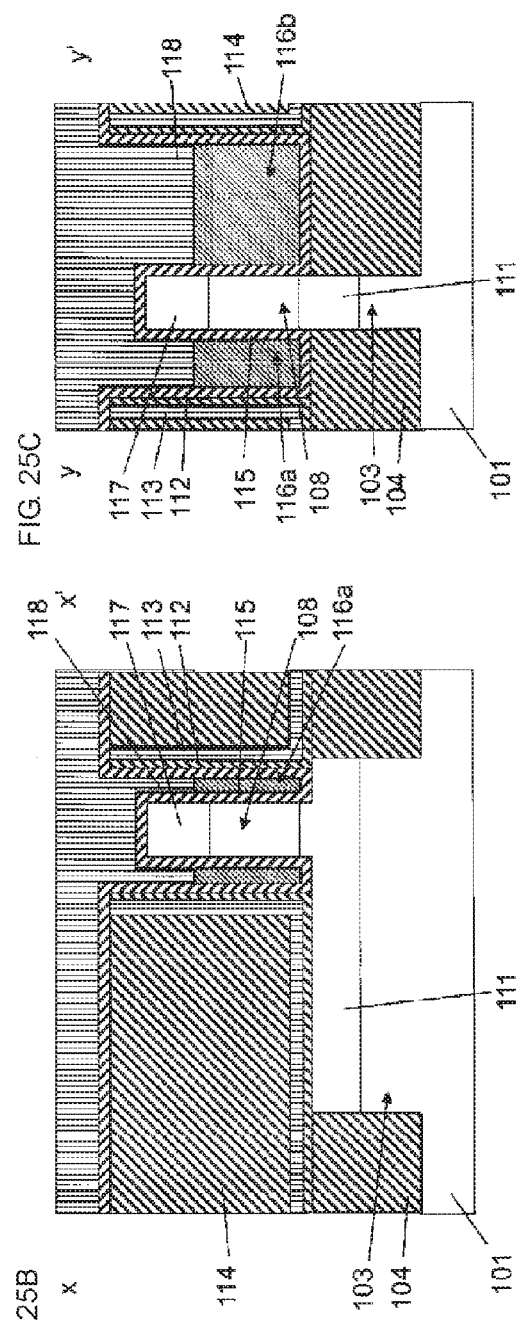
FIG. 25A
FIG. 25B
FIG. 25C

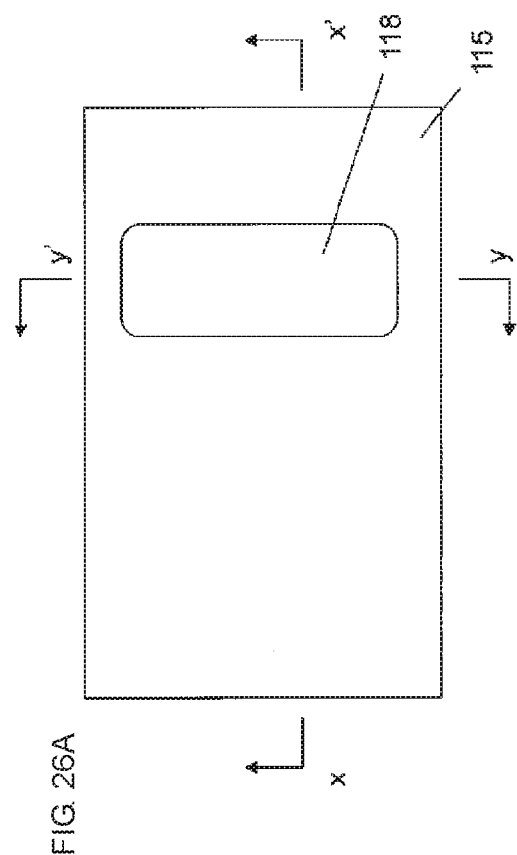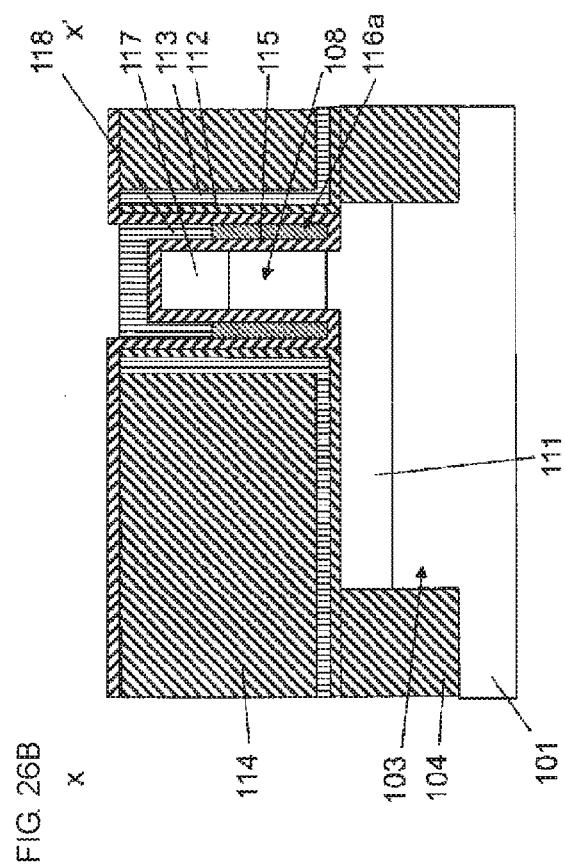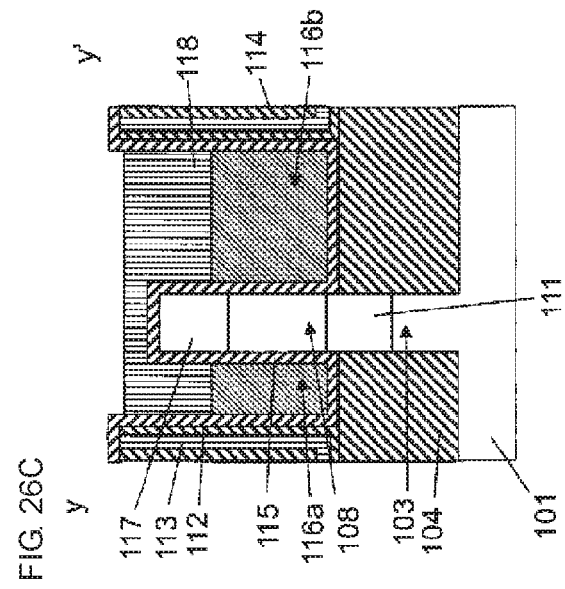

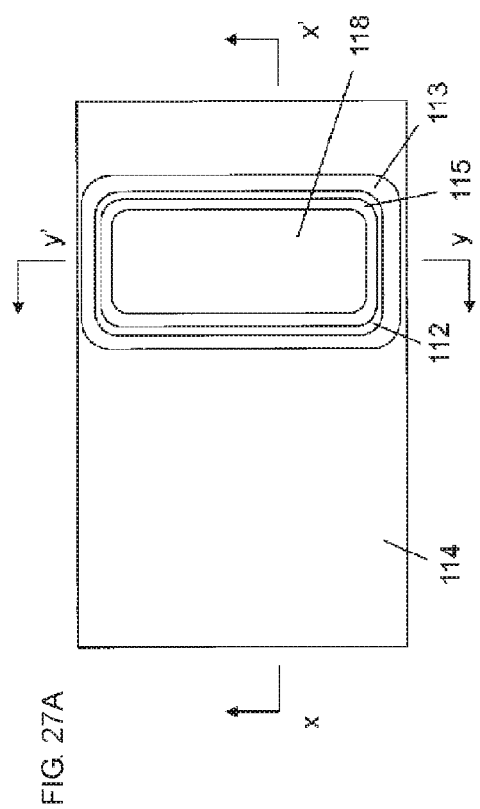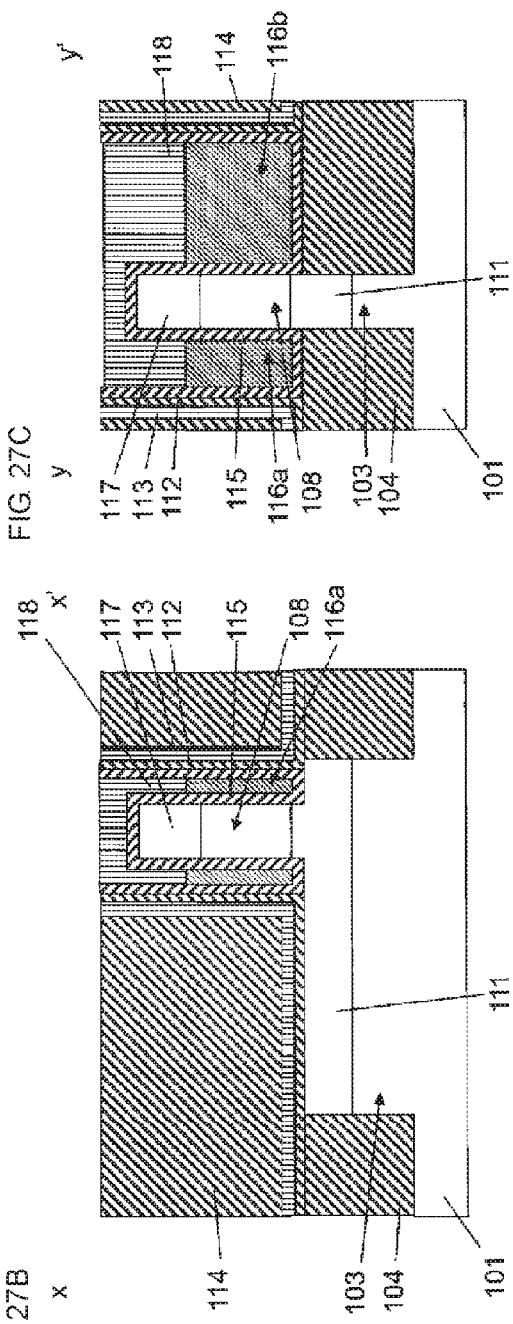

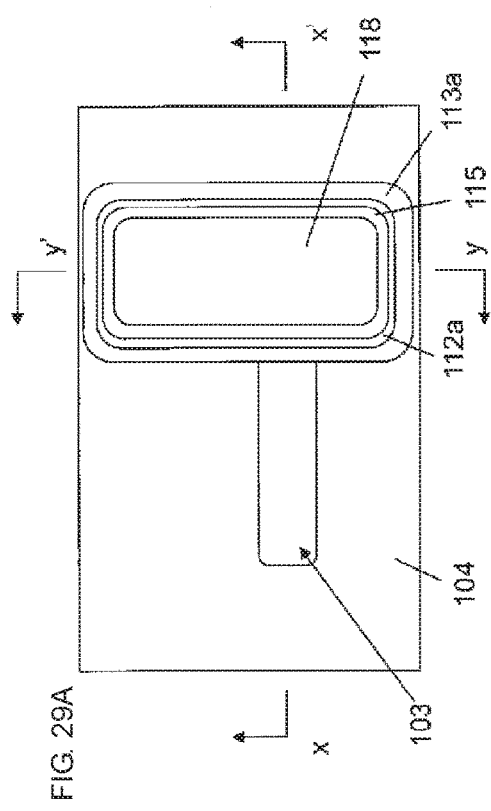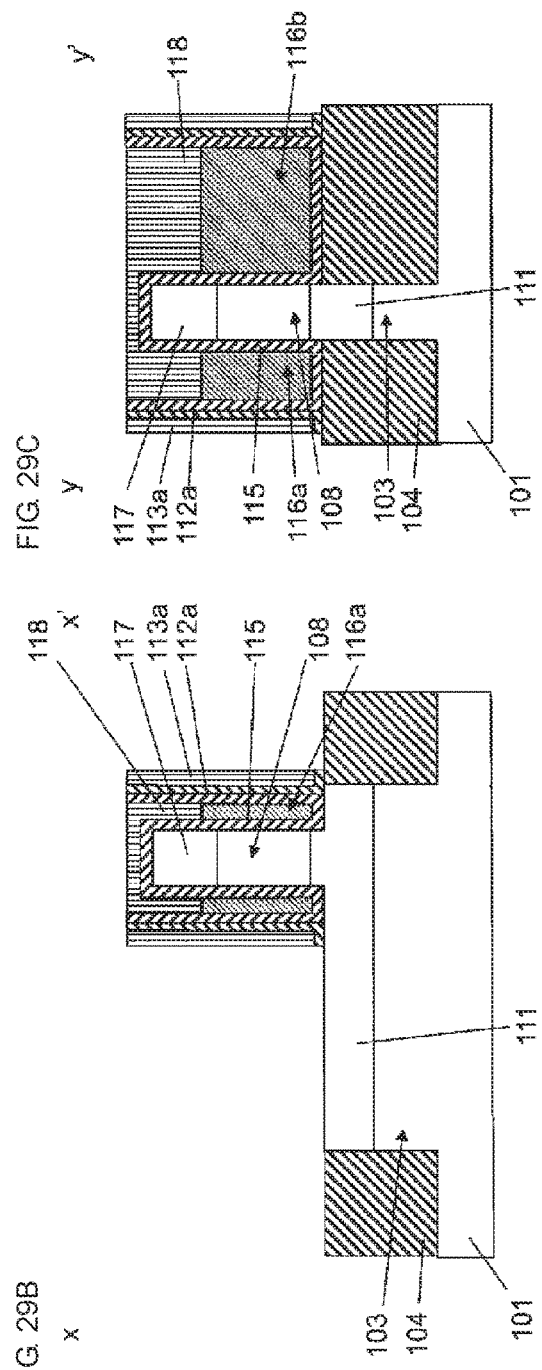

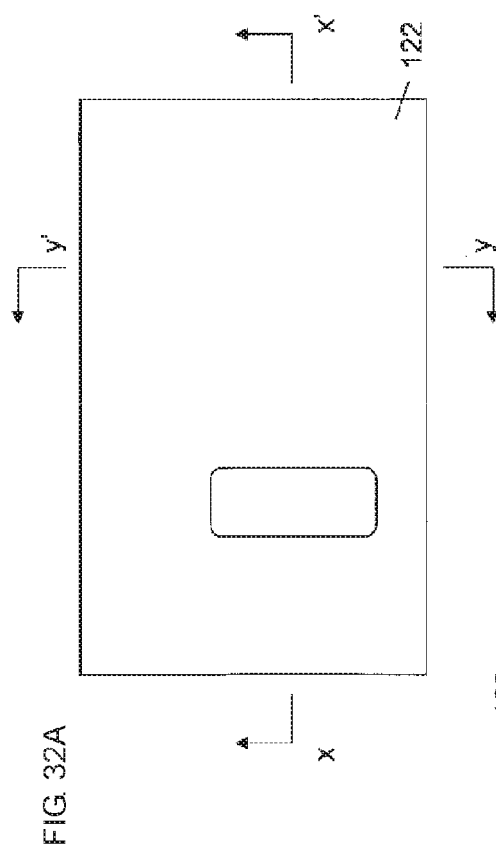
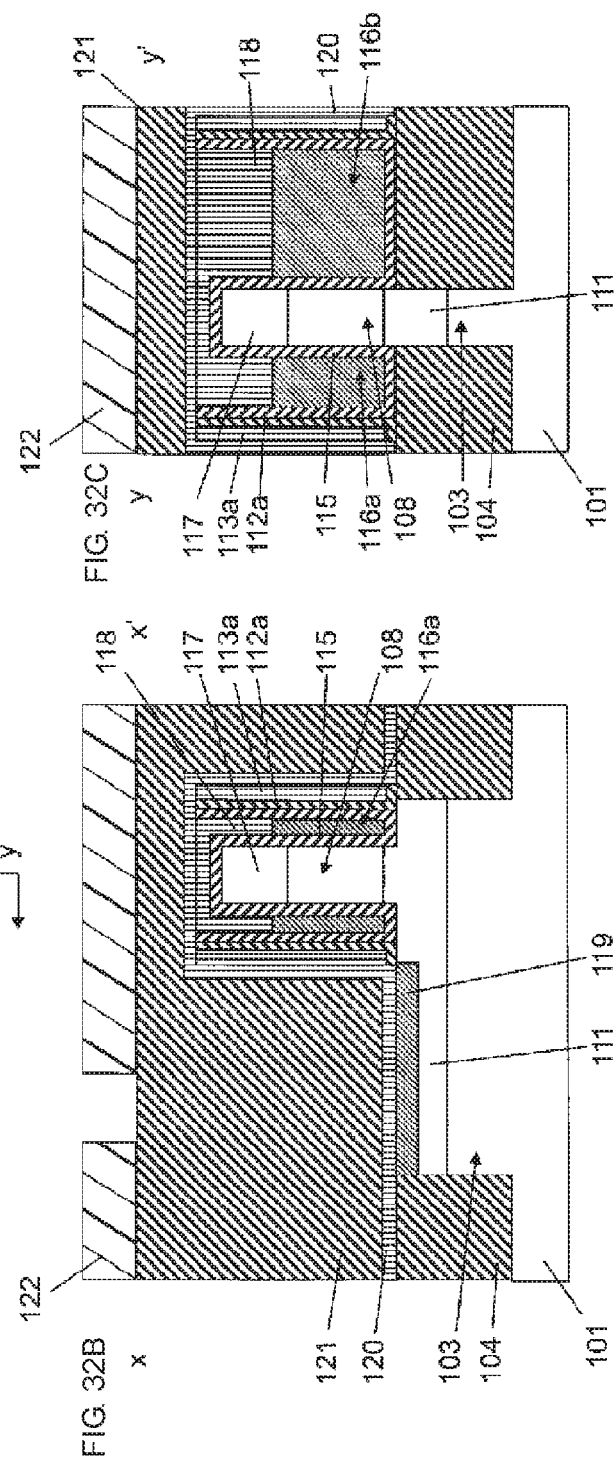
FIG. 32A
FIG. 32B
FIG. 32C

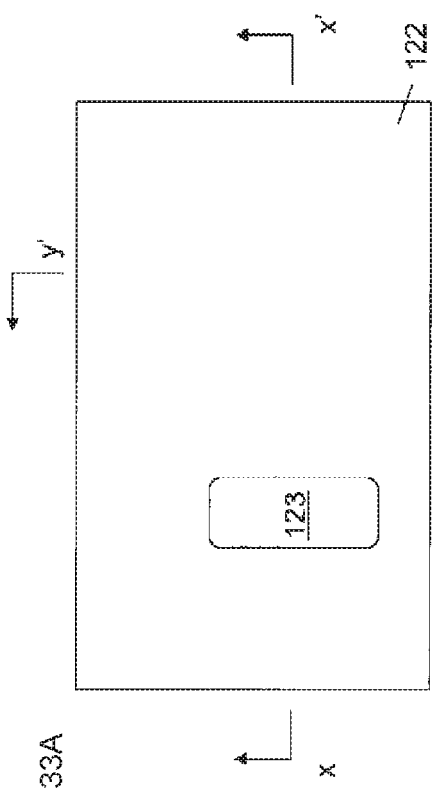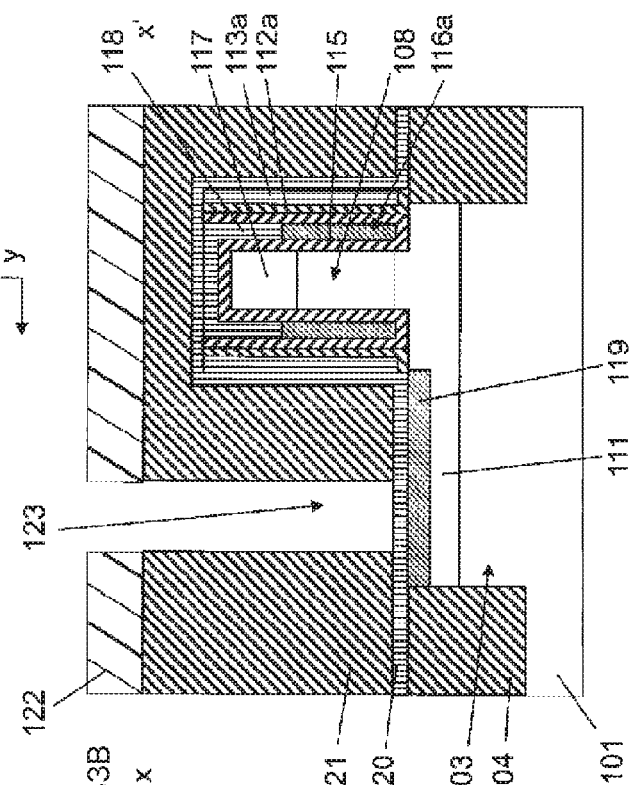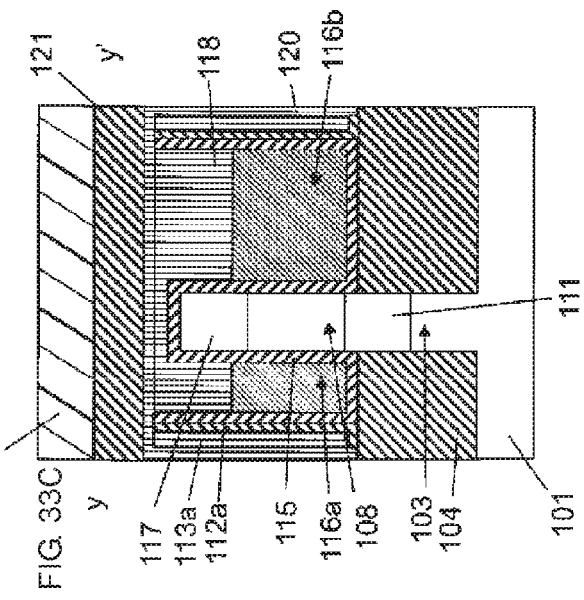
FIG. 33A
FIG. 33B
FIG. 33C

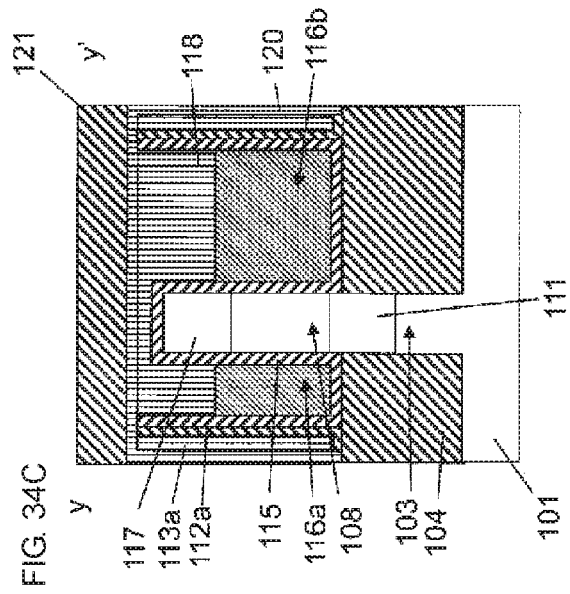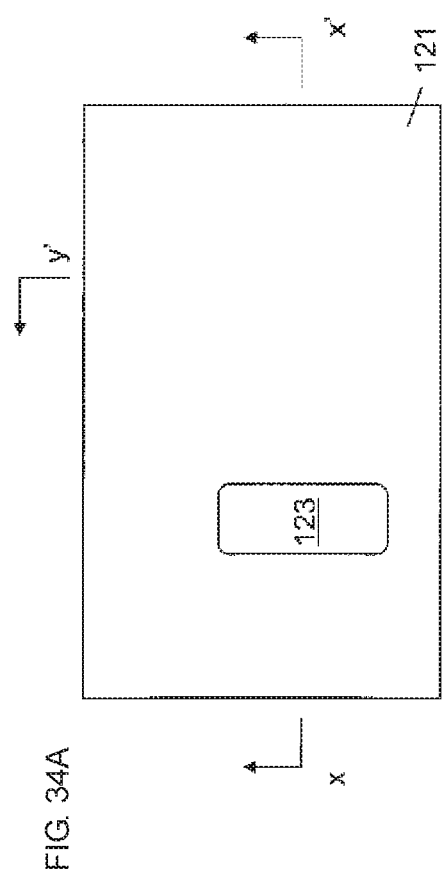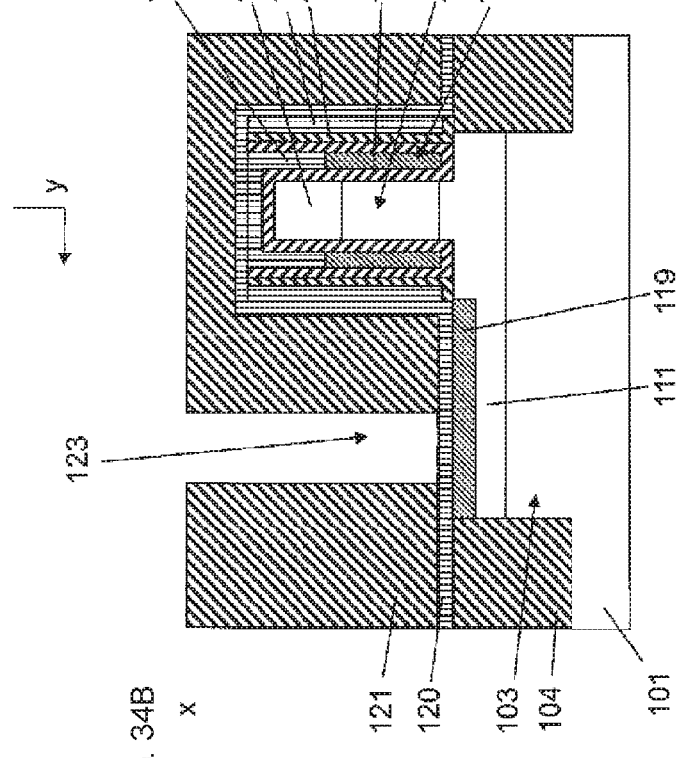

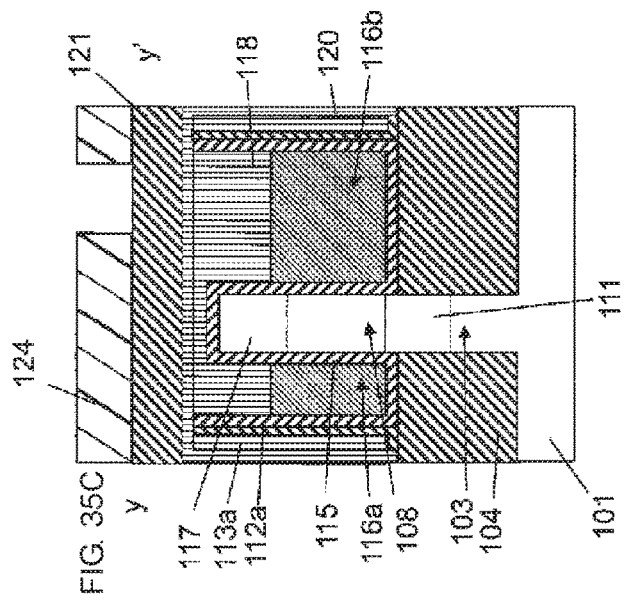
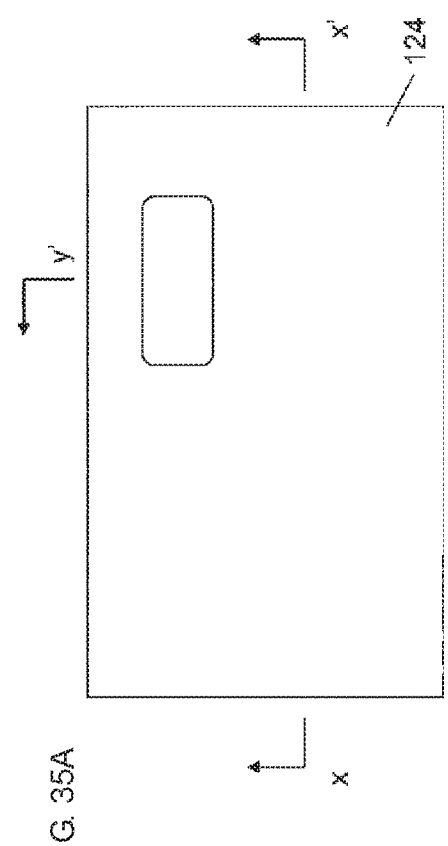
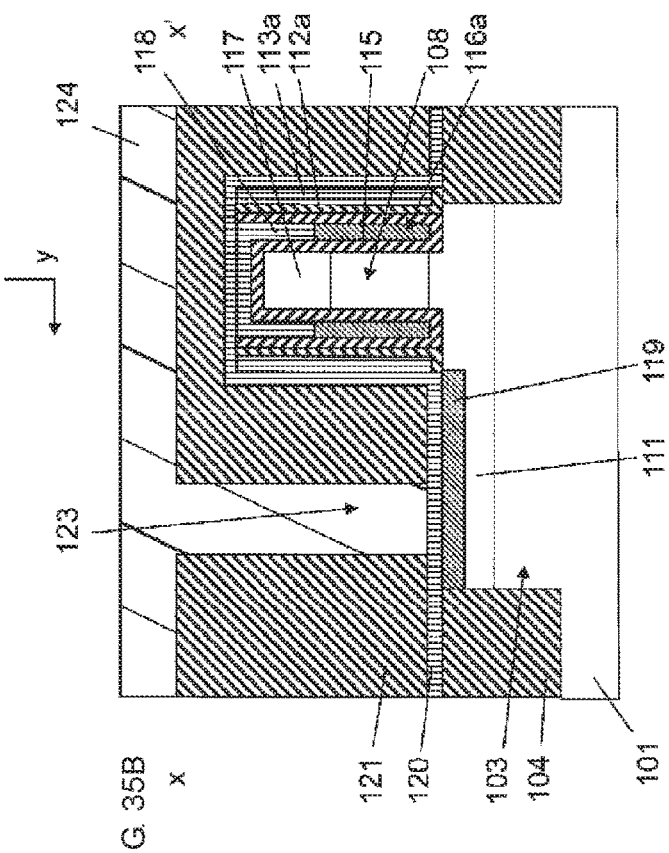

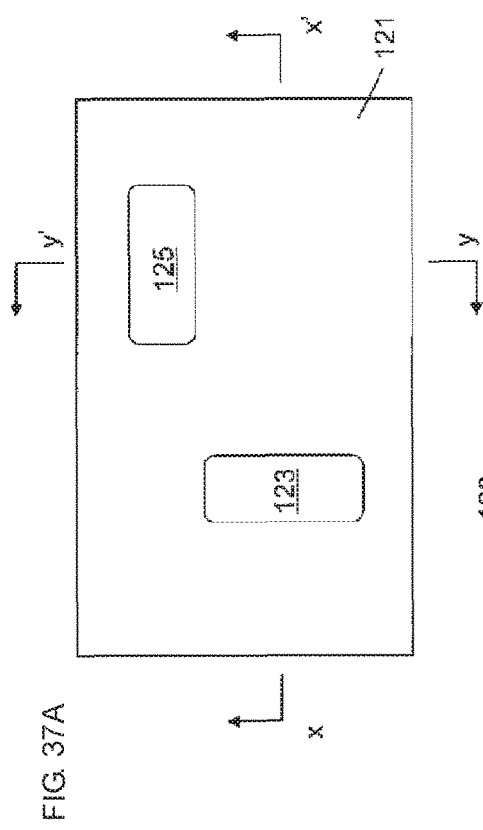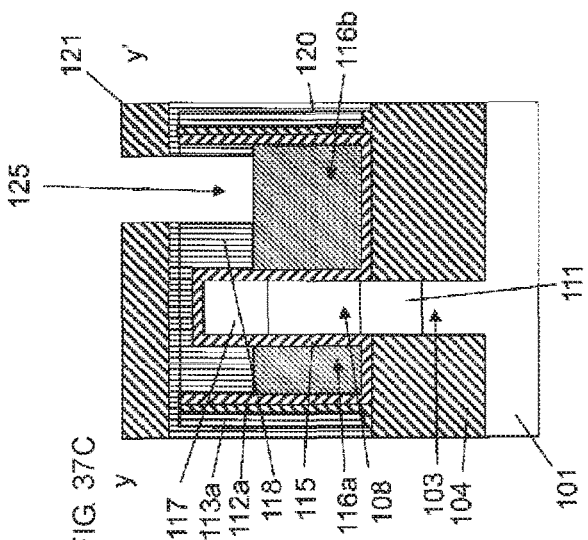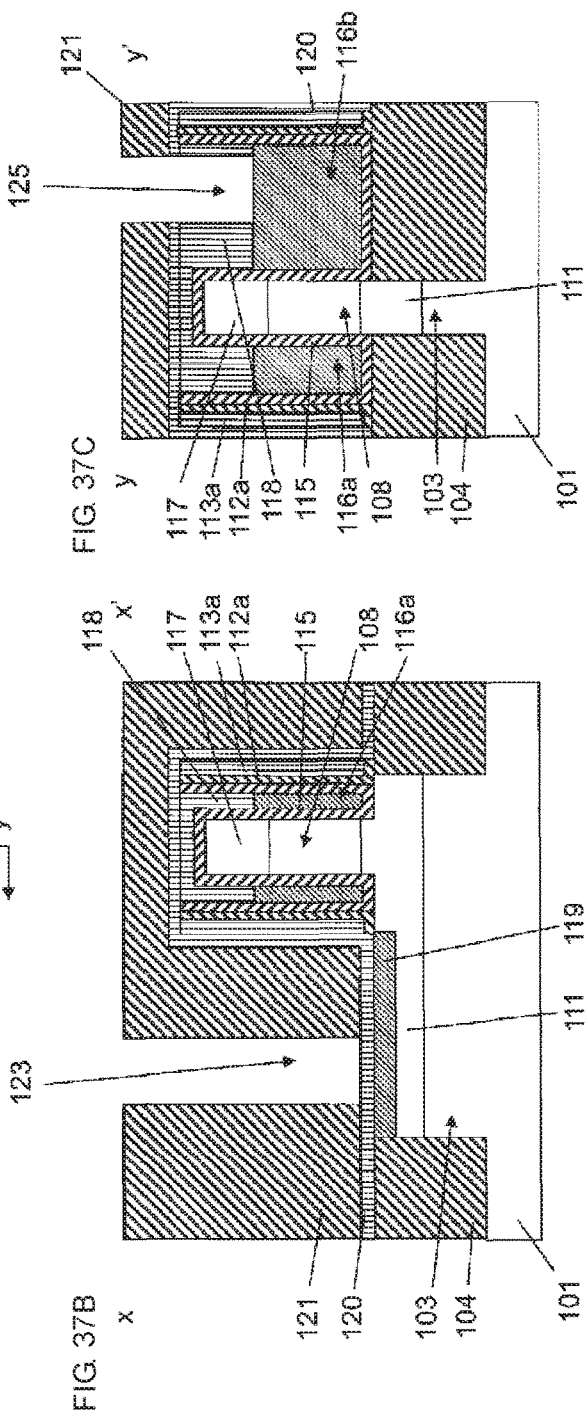

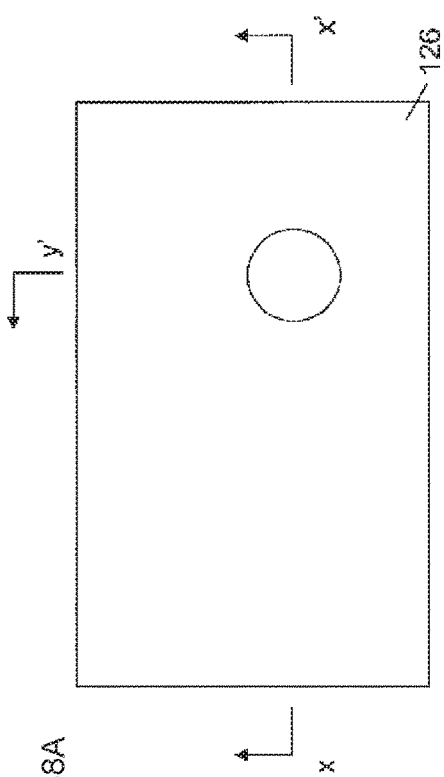
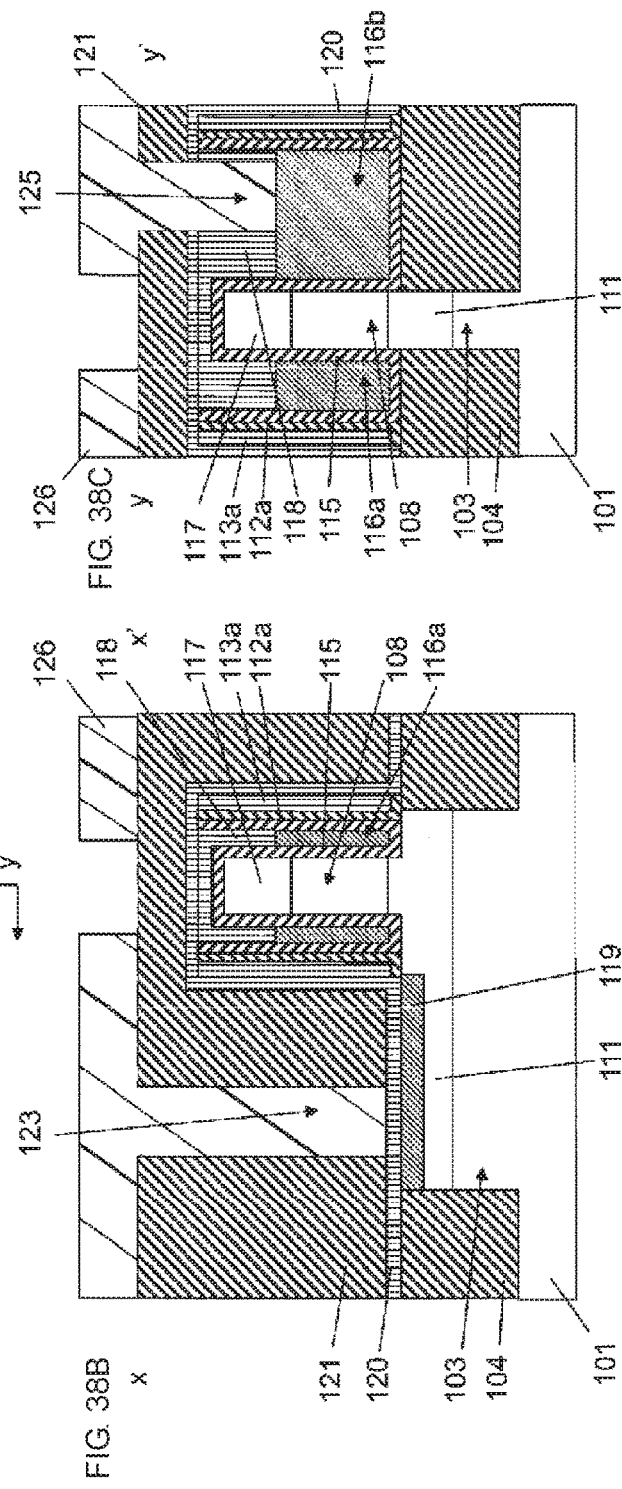
FIG. 38A
FIG. 38B
FIG. 38C

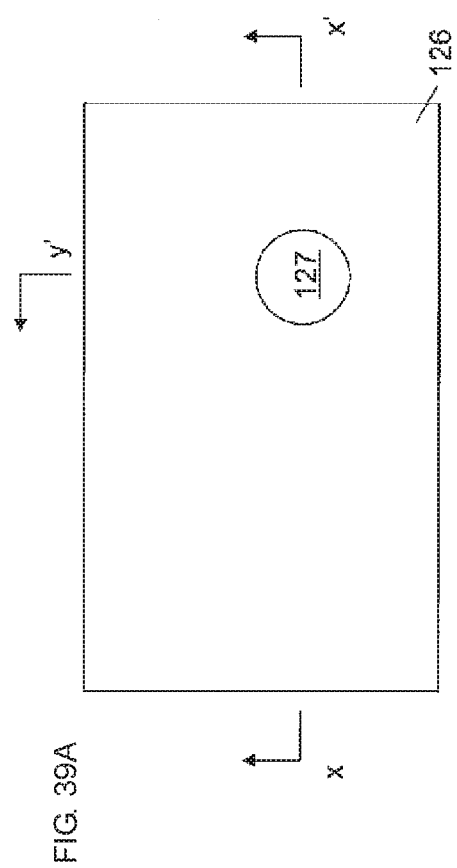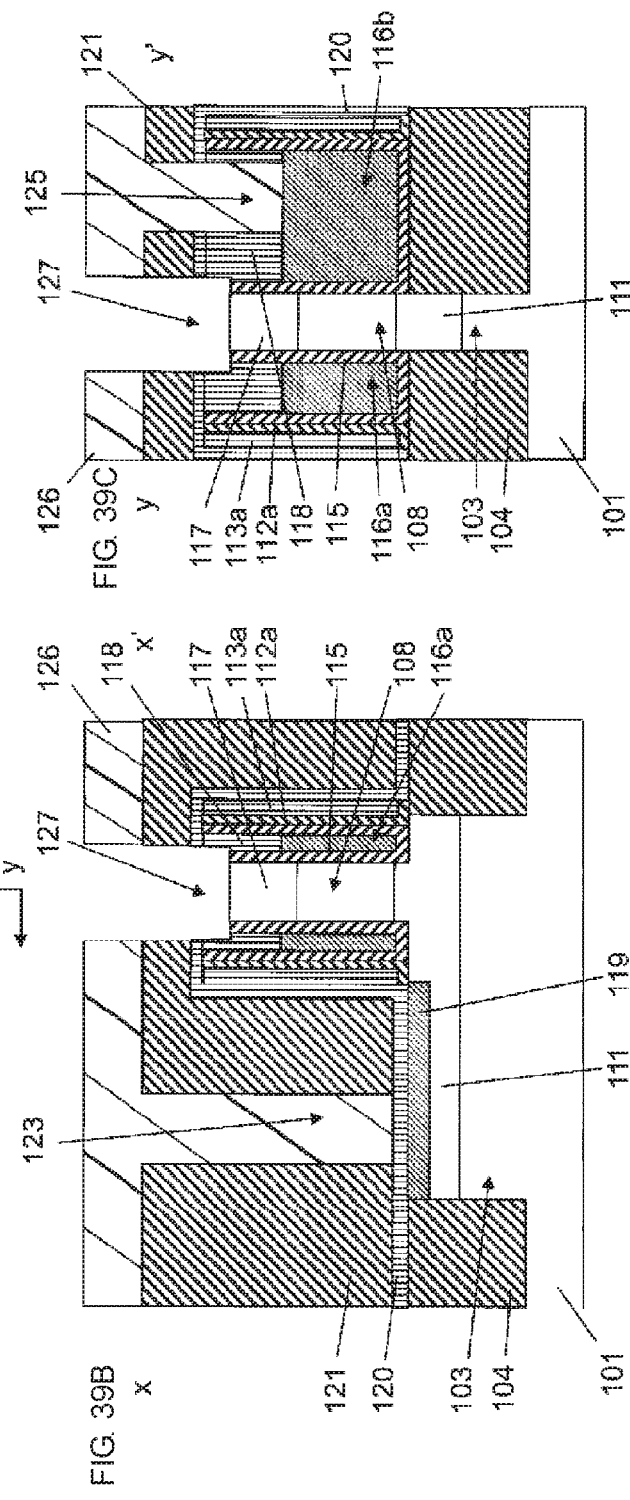

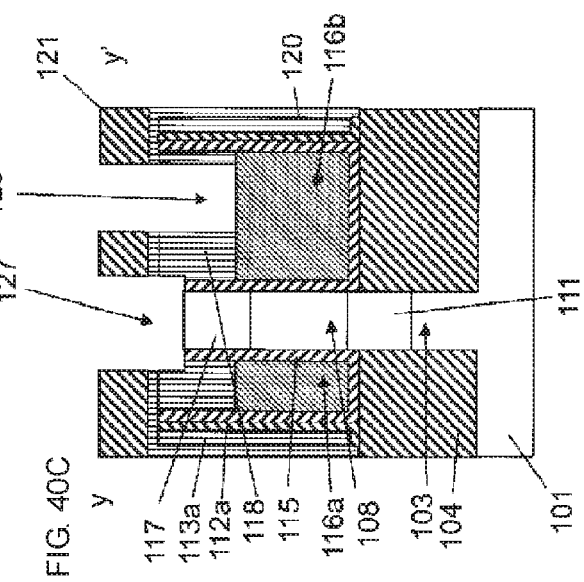
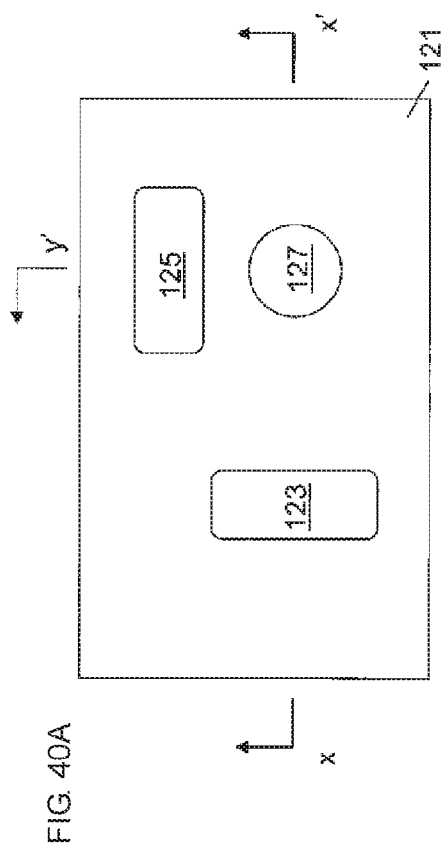
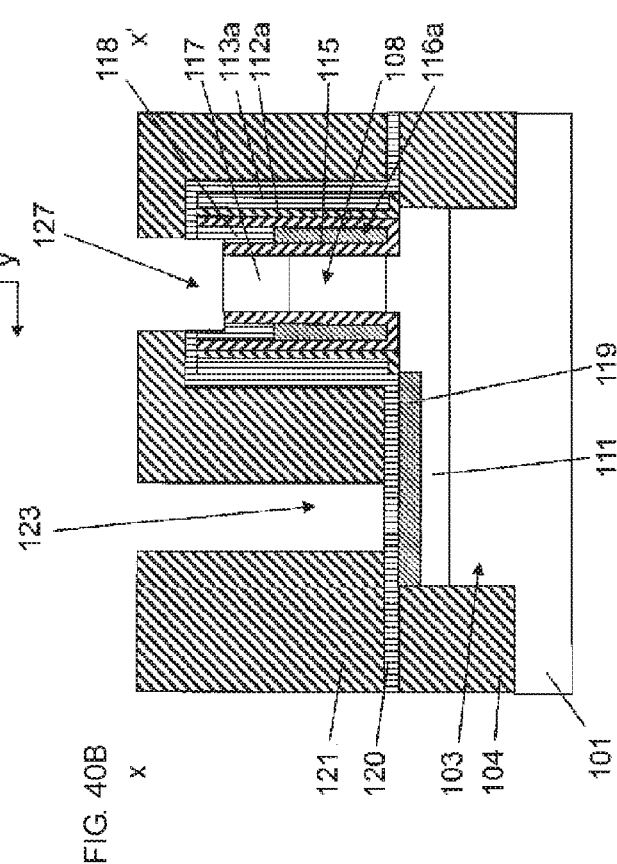

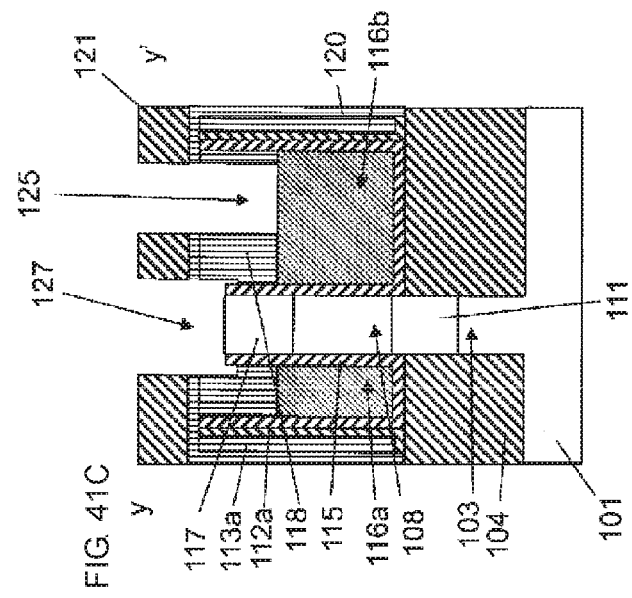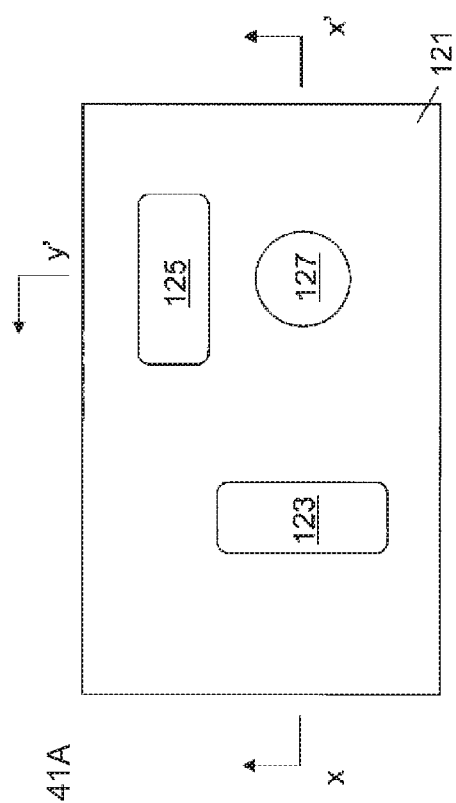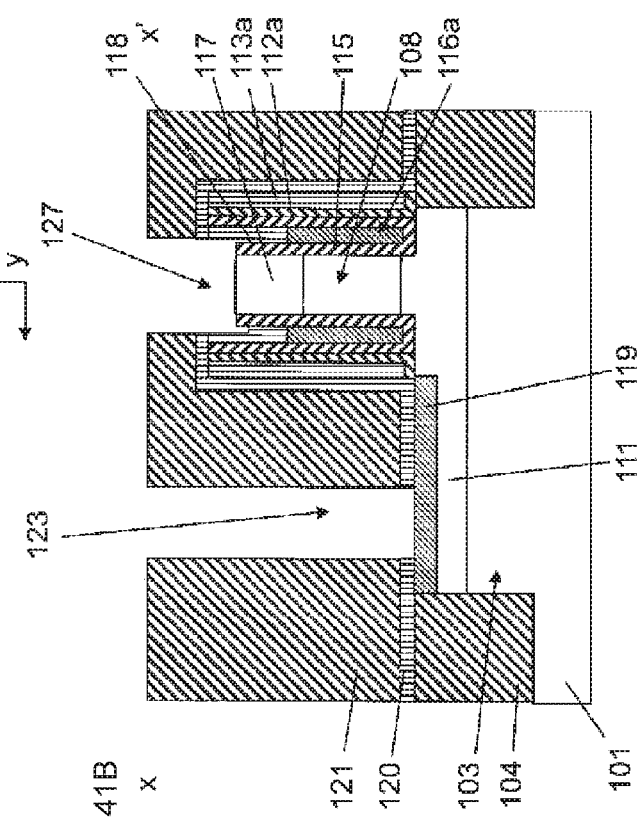

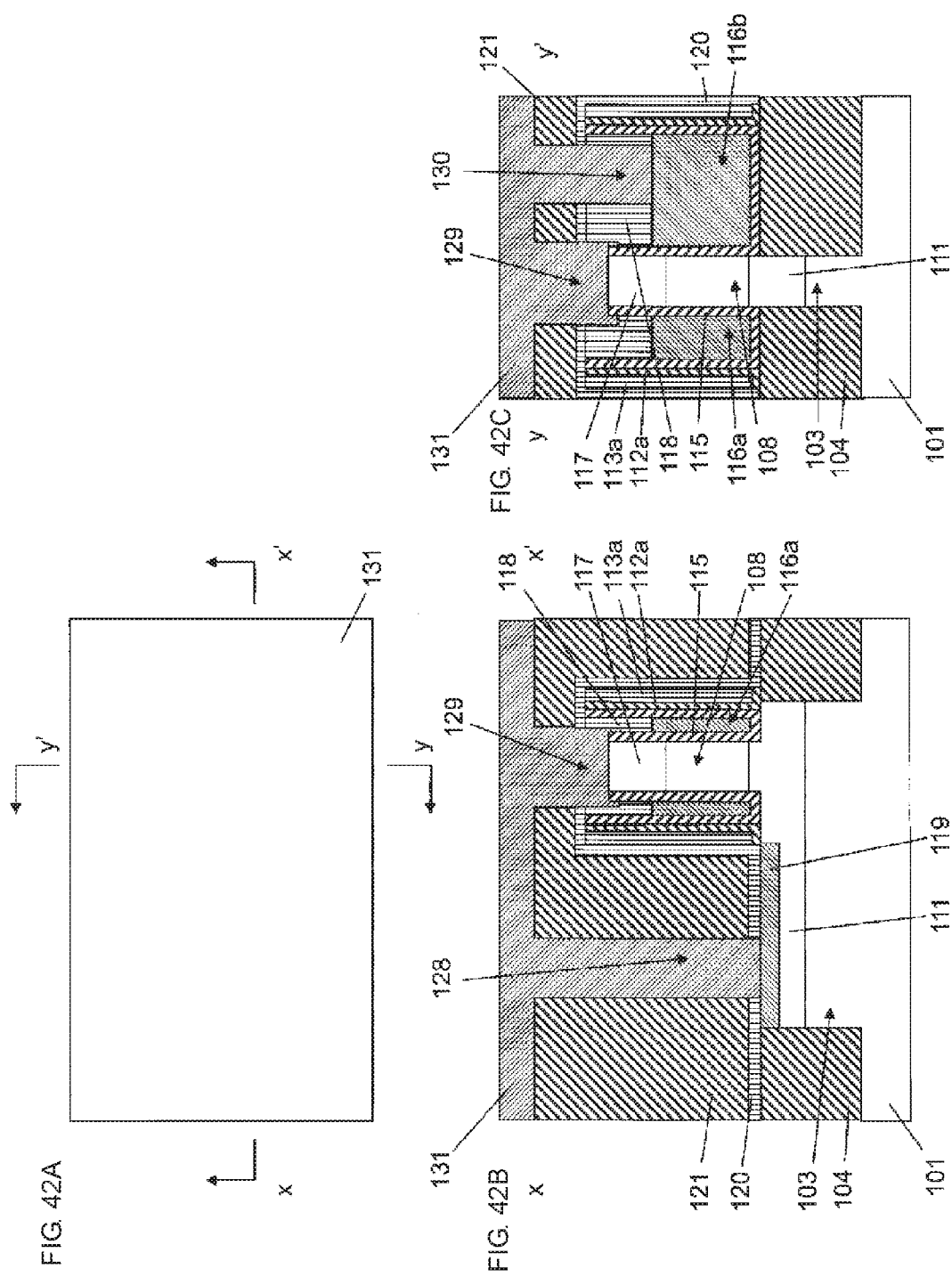

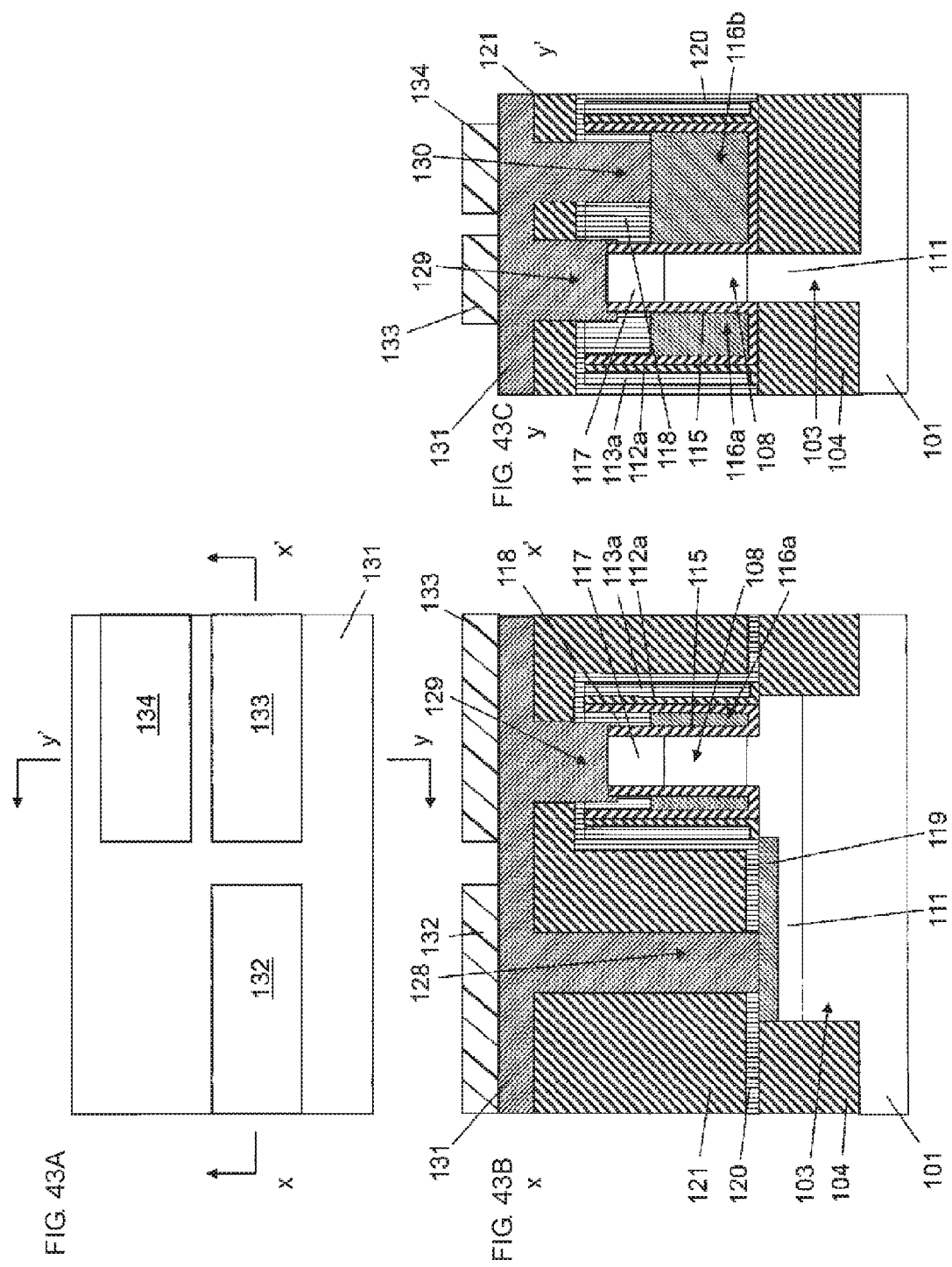

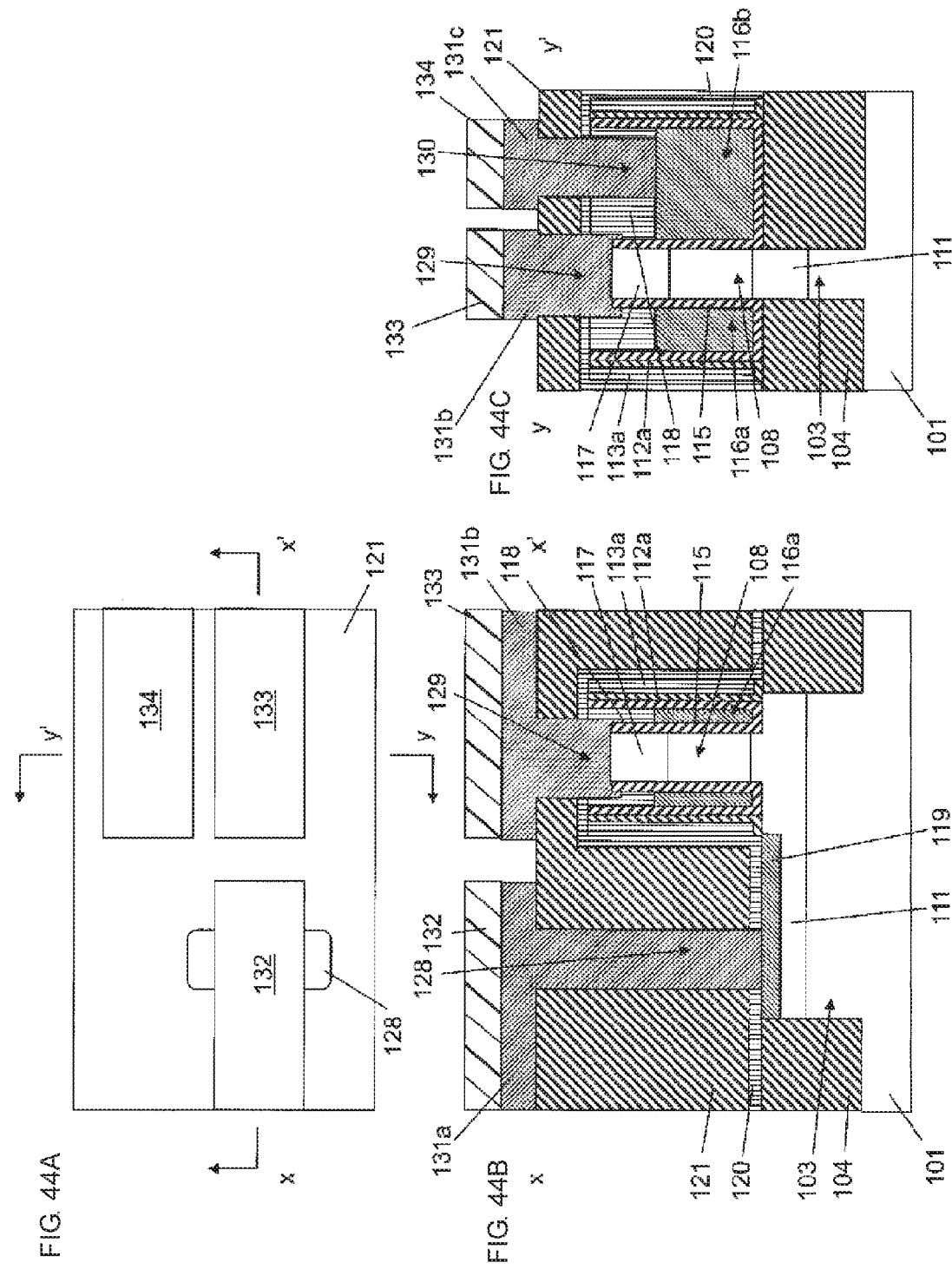

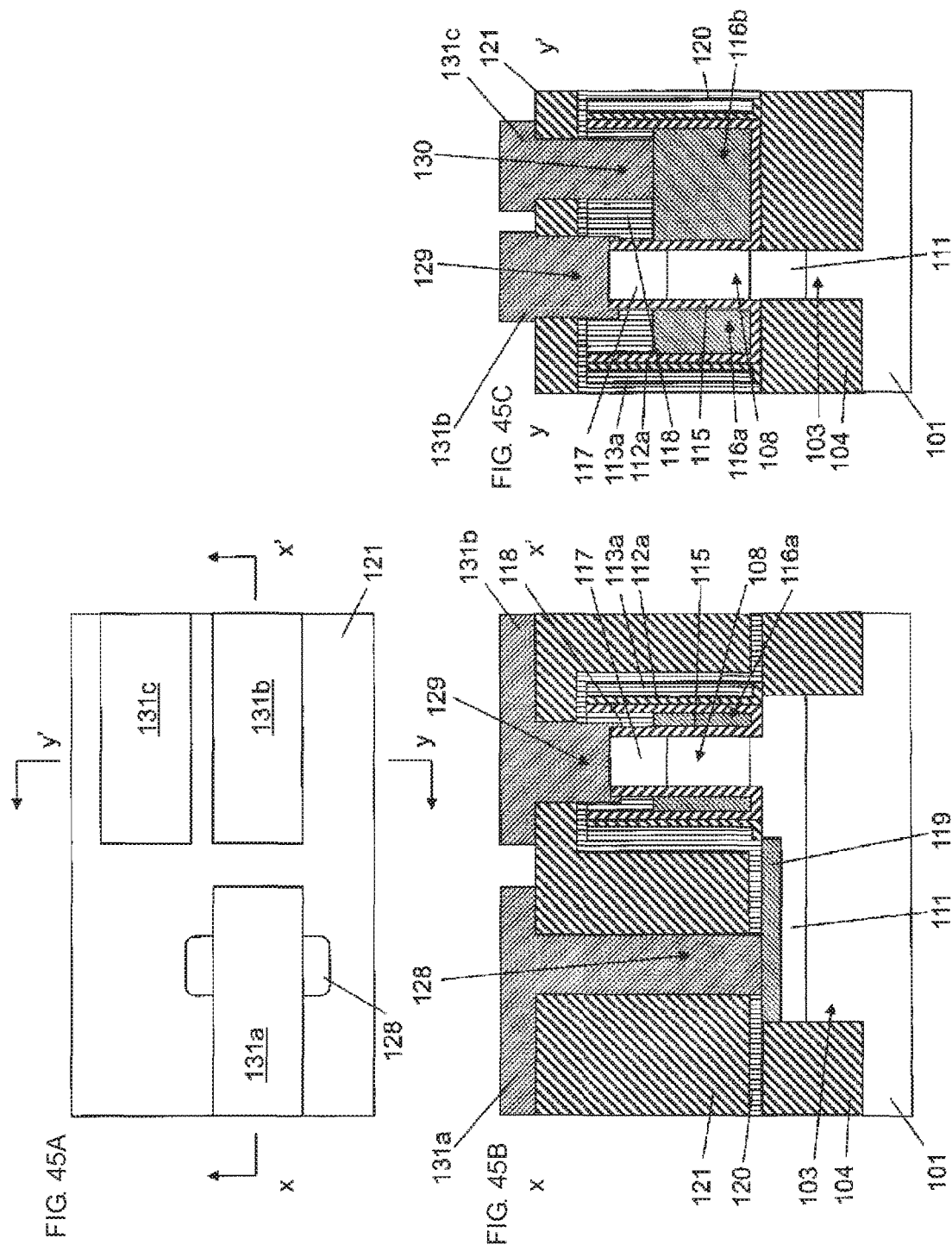

US 9,647,142 B2

METHOD FOR PRODUCING SEMICONDUCTOR DEVICE AND SEMICONDUCTOR DEVICE

CROSS REFERENCES TO RELATED APPLICATION

This application is a continuation of international patent application PCT/JP2014/065870, filed Jun. 16, 2014, the entire contents of which are incorporated herein by reference.

BACKGROUND OF THE INVENTION

Field of the Invention

The present invention relates to a method for producing a semiconductor device and a semiconductor device.

Description of the Related Art

For semiconductor integrated circuits, in particular, integrated circuits employing MOS transistors, the degree of integration has been continuously increased. With this increase in the degree of integration, the size of MOS transistors in such integrated circuits has been reduced to the order of nanometers. In such small MOS transistors, leak current is difficult to suppress. Thus, from the standpoint of ensuring a sufficiently large current, reduction in the circuit area is difficult to achieve, which has been problematic. In order to address this problem, a Surrounding Gate Transistor (hereafter, referred to as an "SGT") has been proposed, the SGT having a structure in which a source, a gate, and a drain are disposed so as to be perpendicular to a substrate and a gate electrode is disposed so as to surround a pillar-shaped semiconductor layer (for example, refer to Japanese Unexamined Patent Application Publication Nos. 2-71556, 2-188966, and 3-145761).

In existing SGT production methods, a mask for defining a silicon pillar is used to form the silicon pillar including a pillar-shaped nitride-film hard mask; a mask for defining a planar silicon layer is used to form the planar silicon layer under the silicon pillar; and a mask for defining a gate line is used to form the gate line (for example, refer to Japanese Unexamined Patent Application Publication No. 2009-182317).

In other words, three masks are used to form the silicon pillar, the planar silicon layer, and the gate line.

Existing MOS transistors employ a first insulating film in order to decrease the parasitic capacitance between the gate line and the substrate. For example, in FINFET (IEDM2010 CC. Wu, et. al, 27.1.1-27.1.4), a first insulating film is formed around a fin-shaped semiconductor layer and the first insulating film is subjected to etch back to expose the fin-shaped semiconductor layer, so that the parasitic capacitance between the gate line and the substrate is decreased. Thus, SGTs also need to employ a first insulating film in order to decrease the parasitic capacitance between the gate line and the substrate. Since SGTs include a fin-shaped semiconductor layer and also a pillar-shaped semiconductor layer, how to form the pillar-shaped semiconductor layer needs to be considered.

An underlap between a gate and a diffusion layer results in a decrease in the current of the transistor. A large overlap between a gate and a diffusion layer results in an increase in the overlap capacitance. Thus, the diffusion layer is desirably formed so as to be self-aligned with the gate.

SUMMARY OF THE INVENTION

Accordingly, an object is to provide a method for producing an SGT in which two masks are used to form a fin-shaped semiconductor layer, a pillar-shaped semiconductor layer, a gate electrode, and a gate line, and a diffusion layer is formed so as to be self-aligned with the gate; and to provide the resultant SGT structure.

A method for producing a semiconductor device according to an embodiment of the present invention includes a first step of forming a fin-shaped semiconductor layer on a semiconductor substrate, forming a first insulating film around the fin-shaped semiconductor layer, and etching the first insulating film to expose an upper portion of the fin-shaped semiconductor layer; a second step of, after the first step, forming a second insulating film around the upper portion of the fin-shaped semiconductor layer, depositing a first polysilicon on the second insulating film and planarizing the first polysilicon, forming a second resist for forming a gate line and a pillar-shaped semiconductor layer, in a direction perpendicular to a direction of the fin-shaped semiconductor layer, and etching the first polysilicon, the second insulating film, and the fin-shaped semiconductor layer to form a pillar-shaped semiconductor layer and a first dummy gate formed of the first polysilicon; a third step of, after the second step, forming a fourth insulating film around the pillar-shaped semiconductor layer and the first dummy gate and forming a second dummy gate on side walls of the first dummy gate and the pillar-shaped semiconductor layer; a fourth step of, after the third step, forming a fifth insulating film and a sixth insulating film around the second dummy gate; a fifth step of, after the fourth step, depositing a first interlayer insulating film, performing chemical mechanical polishing to expose upper portions of the second dummy gate and the first dummy gate, removing the second dummy gate and the first dummy gate, removing the second insulating film and the fourth insulating film, forming a gate insulating film around the pillar-shaped semiconductor layer, depositing metal, and performing etch back to form a gate electrode and a gate line; and a sixth step of, after the fifth step, forming a first diffusion layer in an upper portion of the pillar-shaped semiconductor layer.

The method may further include a substep of, after the third step, forming a second diffusion layer in an upper portion of the fin-shaped semiconductor layer.

The method may further include a seventh step of, after the sixth step, forming a seventh insulating film on the gate electrode and the gate line.

The method may further include an eighth step of, after the seventh step, removing the first interlayer insulating film, etching the fifth insulating film and the sixth insulating film to form insulating film sidewalls from the fifth insulating film and the sixth insulating film, and forming a metal-semiconductor compound on the second diffusion layer.

A semiconductor device according to an embodiment of the present invention includes a fin-shaped semiconductor layer formed on a semiconductor substrate; a first insulating film formed around the fin-shaped semiconductor layer; a pillar-shaped semiconductor layer formed on the fin-shaped semiconductor layer; a gate insulating film formed around the pillar-shaped semiconductor layer; a gate electrode formed around the gate insulating film and formed of metal; a gate line connected to the gate electrode, formed of metal, and extending in a direction perpendicular to the fin-shaped semiconductor layer; a first diffusion layer formed in an upper portion of the pillar-shaped semiconductor layer; a second diffusion layer formed in an upper portion of the fin-shaped semiconductor layer; a semiconductor-metal compound layer formed on the second diffusion layer; and a contact directly connected to the first diffusion layer, wherein the gate electrode and the gate line are heat-treated at 900° C. or higher, and the gate electrode and the gate line are surrounded and covered by the gate insulating film, a fifth insulating film that is an oxide film, and a sixth insulating film.

The semiconductor device may include the second diffusion layer formed in a lower portion of the pillar-shaped semiconductor layer; and the gate insulating film formed around and under the gate electrode and the gate line, wherein a width of the pillar-shaped semiconductor layer may be equal to a width of the fin-shaped semiconductor layer, and an outer width of the gate electrode may be equal to a width of the gate line.

Embodiments of the present invention can provide a method for producing an SGT in which two masks are used to form a fin-shaped semiconductor layer, a pillar-shaped semiconductor layer, a gate electrode, and a gate line, and a diffusion layer is formed so as to be self-aligned with the gate; and can provide the resultant SGT structure.

A method for producing a semiconductor device according to an embodiment of the present invention includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film and planarizing the first polysilicon, forming a second resist for forming a gate line and a pillar-shaped semiconductor layer, in a direction perpendicular to the direction of the fin-shaped semiconductor layer, and etching the first polysilicon, the second insulating film, and the fin-shaped semiconductor layer to form a pillar-shaped semiconductor layer and a first dummy gate formed of the first polysilicon; and a third step of, after the second step, forming a fourth insulating film around the pillar-shaped semiconductor layer and the first dummy gate and forming a second dummy gate on side walls of the first dummy gate and the pillar-shaped semiconductor layer. As a result, two masks are used to form the fin-shaped semiconductor layer, the pillar-shaped semiconductor layer, and the first dummy gate and the second dummy gate that are to provide a gate electrode and a gate line. Thus, the number of steps can be reduced.

The misalignment between the pillar-shaped semiconductor layer and the gate line can be eliminated.

The method for producing a semiconductor device further includes a fifth step of, after the fourth step, depositing a first interlayer insulating film, performing chemical mechanical polishing to expose upper portions of the second dummy gate and the first dummy gate, removing the second dummy gate and the first dummy gate, removing the second insulating film and the fourth insulating film, forming a gate insulating film around the pillar-shaped semiconductor layer, depositing metal, and performing etch back to form a gate electrode and a gate line; and a sixth step of, after the fifth step, forming a first diffusion layer in an upper portion of the pillar-shaped semiconductor layer. As a result, the diffusion layer in the upper portion of the pillar-shaped semiconductor layer can be formed so as to be self-aligned with the gate. Since the metal gate is heat-treated at 900° C. or higher, a metal can be used that is heat-treated to have a work function of about 4.6 eV, which corresponds to the midgap of silicon.

The gate insulating film formed around and under the gate electrode and the gate line enables insulation of the gate electrode and the gate line from the pillar-shaped semiconductor layer and the fin-shaped semiconductor layer.

BRIEF DESCRIPTION OF THE SEVERAL VIEWS OF THE DRAWING

FIG. 1A is a plan view of a semiconductor device according to an embodiment of the present invention; FIG. 1B is a sectional view taken along line x-x' in FIG. 1A; and FIG. 1C is a sectional view taken along line y-y' in FIG. 1A.

FIG. 3A is a plan view for explaining a method for producing a semiconductor device according to an embodiment of the present invention; FIG. 3B is a sectional view taken along line x-x' in FIG. 3A; and FIG. 3C is a sectional view taken along line y-y' in FIG. 3A.

FIG. 4A is a plan view for explaining a method for producing a semiconductor device according to an embodiment of the present invention; FIG. 4B is a sectional view taken along line x-x' in FIG. 4A; and FIG. 4C is a sectional view taken along line y-y' in FIG. 4A.

FIG. 5A is a plan view for explaining a method for producing a semiconductor device according to an embodiment of the present invention; FIG. 5B is a sectional view taken along line x-x' in FIG. 5A; and FIG. 5C is a sectional view taken along line y-y' in FIG. 5A.

FIG. 7A is a plan view for explaining a method for producing a semiconductor device according to an embodiment of the present invention; FIG. 7B is a sectional view taken along line x-x' in FIG. 7A; and FIG. 7C is a sectional view taken along line y-y' in FIG. 7A.

FIG. 9A is a plan view for explaining a method for producing a semiconductor device according to an embodiment of the present invention; FIG. 9B is a sectional view taken along line x-x' in FIG. 9A; and FIG. 9C is a sectional view taken along line y-y' in FIG. 9A.

FIG. 10A is a plan view for explaining a method for producing a semiconductor device according to an embodiment of the present invention; FIG. 10B is a sectional view taken along line x-x' in FIG. 10A; and FIG. 10C is a sectional view taken along line y-y' in FIG. 10A.

FIG. 11A is a plan view for explaining a method for producing a semiconductor device according to an embodiment of the present invention; FIG. 11B is a sectional view taken along line x-x' in FIG. 11A; and FIG. 11C is a sectional view taken along line y-y' in FIG. 11A.

FIG. 13A is a plan view for explaining a method for producing a semiconductor device according to an embodiment of the present invention; FIG. 13B is a sectional view taken along line x-x' in FIG. 13A; and FIG. 13C is a sectional view taken along line y-y' in FIG. 13A.

FIG. 14A is a plan view for explaining a method for producing a semiconductor device according to an embodiment of the present invention; FIG. 14B is a sectional view taken along line x-x' in FIG. 14A; and FIG. 14C is a sectional view taken along line y-y' in FIG. 14A.

FIG. 15A is a plan view for explaining a method for producing a semiconductor device according to an embodiment of the present invention; FIG. 15B is a sectional view taken along line x-x' in FIG. 15A; and FIG. 15C is a sectional view taken along line y-y' in FIG. 15A.

FIG. 16A is a plan view for explaining a method for producing a semiconductor device according to an embodiment of the present invention; FIG. 16B is a sectional view taken along line x-x' in FIG. 16A; and FIG. 16C is a sectional view taken along line y-y' in FIG. 16A.

FIG. 17A is a plan view for explaining a method for producing a semiconductor device according to an embodiment of the present invention; FIG. 17B is a sectional view taken along line x-x' in FIG. 17A; and FIG. 17C is a sectional view taken along line y-y' in FIG. 17A.

FIG. 18A is a plan view for explaining a method for producing a semiconductor device according to an embodiment of the present invention; FIG. 18B is a sectional view taken along line x-x' in FIG. 18A; and FIG. 18C is a sectional view taken along line y-y' in FIG. 18A.

FIG. 20A is a plan view for explaining a method for producing a semiconductor device according to an embodiment of the present invention; FIG. 20B is a sectional view taken along line x-x' in FIG. 20A; and FIG. 20C is a sectional view taken along line y-y' in FIG. 20A.

FIG. 21A is a plan view for explaining a method for producing a semiconductor device according to an embodiment of the present invention; FIG. 21B is a sectional view taken along line x-x' in FIG. 21A; and FIG. 21C is a sectional view taken along line y-y' in FIG. 21A.

FIG. 22A is a plan view for explaining a method for producing a semiconductor device according to an embodiment of the present invention; FIG. 22B is a sectional view taken along line x-x' in FIG. 22A; and FIG. 22C is a sectional view taken along line y-y' in FIG. 22A.

FIG. 23A is a plan view for explaining a method for producing a semiconductor device according to an embodiment of the present invention; FIG. 23B is a sectional view taken along line x-x' in FIG. 23A; and FIG. 23C is a sectional view taken along line y-y' in FIG. 23A.

FIG. 24A is a plan view for explaining a method for producing a semiconductor device according to an embodiment of the present invention; FIG. 24B is a sectional view taken along line x-x' in FIG. 24A; and FIG. 24C is a sectional view taken along line y-y' in FIG. 24A.

FIG. 25A is a plan view for explaining a method for producing a semiconductor device according to an embodiment of the present invention; FIG. 25B is a sectional view taken along line x-x' in FIG. 25A; and FIG. 25C is a sectional view taken along line y-y' in FIG. 25A.

FIG. 26A is a plan view for explaining a method for producing a semiconductor device according to an embodiment of the present invention; FIG. 26B is a sectional view taken along line x-x' in FIG. 26A; and FIG. 26C is a sectional view taken along line y-y' in FIG. 26A.

FIG. 27A is a plan view for explaining a method for producing a semiconductor device according to an embodiment of the present invention; FIG. 27B is a sectional view taken along line x-x' in FIG. 27A; and FIG. 27C is a sectional view taken along line y-y' in FIG. 27A.

FIG. 29A is a plan view for explaining a method for producing a semiconductor device according to an embodiment of the present invention; FIG. 29B is a sectional view taken along line x-x' in FIG. 29A; and FIG. 29C is a sectional view taken along line y-y' in FIG. 29A.

FIG. 32A is a plan view for explaining a method for producing a semiconductor device according to an embodiment of the present invention; FIG. 32B is a sectional view taken along line x-x' in FIG. 32A; and FIG. 32C is a sectional view taken along line y-y' in FIG. 32A.

FIG. 33A is a plan view for explaining a method for producing a semiconductor device according to an embodiment of the present invention; FIG. 33B is a sectional view taken along line x-x' in FIG. 33A; and FIG. 33C is a sectional view taken along line y-y' in FIG. 33A.

FIG. 34A is a plan view for explaining a method for producing a semiconductor device according to an embodiment of the present invention; FIG. 34B is a sectional view taken along line x-x' in FIG. 34A; and FIG. 34C is a sectional view taken along line y-y' in FIG. 34A.

FIG. 35A is a plan view for explaining a method for producing a semiconductor device according to an embodiment of the present invention; FIG. 35B is a sectional view taken along line x-x' in FIG. 35A; and FIG. 35C is a sectional view taken along line y-y' in FIG. 35A.

FIG. 37A is a plan view for explaining a method for producing a semiconductor device according to an embodiment of the present invention; FIG. 37B is a sectional view taken along line x-x' in FIG. 37A; and FIG. 37C is a sectional view taken along line y-y' in FIG. 37A.

FIG. 38A is a plan view for explaining a method for producing a semiconductor device according to an embodiment of the present invention; FIG. 38B is a sectional view taken along line x-x' in FIG. 38A; and FIG. 38C is a sectional view taken along line y-y' in FIG. 38A.

FIG. 39A is a plan view for explaining a method for producing a semiconductor device according to an embodiment of the present invention; FIG. 39B is a sectional view taken along line x-x' in FIG. 39A; and FIG. 39C is a sectional view taken along line y-y' in FIG. 39A.

FIG. 40A is a plan view for explaining a method for producing a semiconductor device according to an embodiment of the present invention; FIG. 40B is a sectional view taken along line x-x' in FIG. 40A; and FIG. 40C is a sectional view taken along line y-y' in FIG. 40A.

FIG. 41A is a plan view for explaining a method for producing a semiconductor device according to an embodiment of the present invention; FIG. 41B is a sectional view taken along line x-x' in FIG. 41A; and FIG. 41C is a sectional view taken along line y-y' in FIG. 41A.

FIG. 42A is a plan view for explaining a method for producing a semiconductor device according to an embodiment of the present invention; FIG. 42B is a sectional view taken along line x-x' in FIG. 42A; and FIG. 42C is a sectional view taken along line y-y' in FIG. 42A.

FIG. 43A is a plan view for explaining a method for producing a semiconductor device according to an embodiment of the present invention; FIG. 43B is a sectional view taken along line x-x' in FIG. 43A; and FIG. 43C is a sectional view taken along line y-y' in FIG. 43A.

FIG. 44A is a plan view for explaining a method for producing a semiconductor device according to an embodiment of the present invention; FIG. 44B is a sectional view taken along line x-x' in FIG. 44A; and FIG. 44C is a sectional view taken along line y-y' in FIG. 44A.

FIG. 45A is a plan view for explaining a method for producing a semiconductor device according to an embodiment of the present invention; FIG. 45B is a sectional view taken along line x-x' in FIG. 45A; and FIG. 45C is a sectional view taken along line y-y' in FIG. 45A.

DESCRIPTION OF THE PREFERRED EMBODIMENTS

Hereinafter, production steps for forming an SGT structure according to an embodiment of the present invention will be described with reference to FIGS. 2A to 45C.

A first step will be first described, the first step including forming a fin-shaped semiconductor layer on a semiconductor substrate, and forming a first insulating film around the fin-shaped semiconductor layer. This embodiment employs a silicon substrate; alternatively, substrates formed of semiconductors other than silicon may be employed.

Figure 2A:
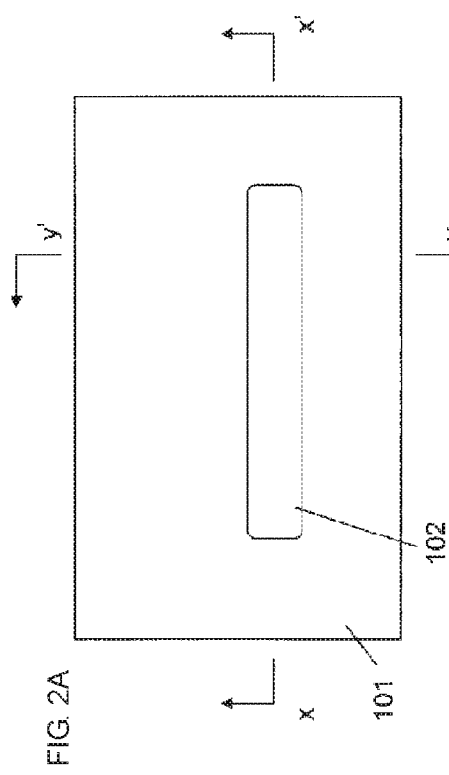
FIG. 2A is a plan view for explaining a method for producing a semiconductor device according to an embodiment of the present invention.
Figure 2C:
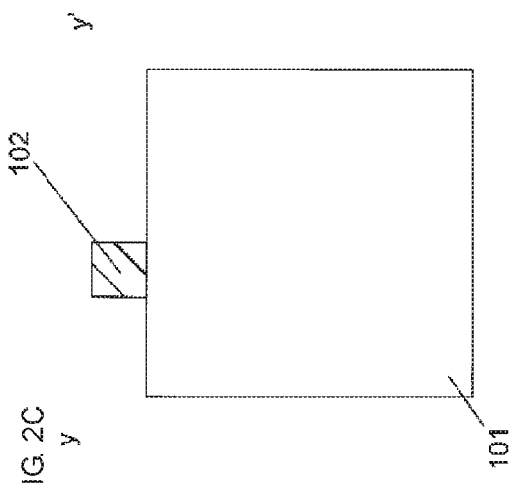
FIG. 2C is a sectional view taken along line y-y' in FIG. 2A.
Figure 2B:
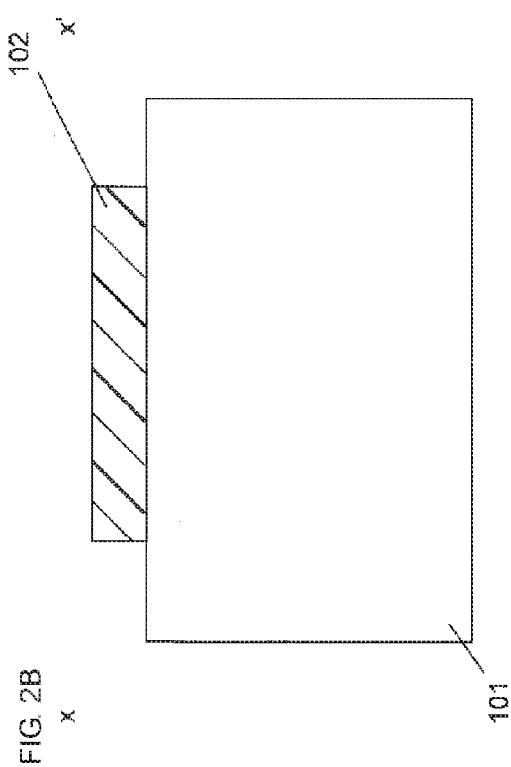
FIG. 2B is a sectional view taken along line x-x' in FIG. 2A.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. In this case, the resist is used as a mask to form the fin-shaped silicon layer; alternatively, a hard mask such as an oxide film or a nitride film may be used. Subsequently, arsenic, phosphorus, or boron may be introduced to perform well formation.

As illustrated in FIGS. 4A to 4C, the first resist 102 is removed.

As illustrated in FIGS. 5A to 5C, a first insulating film 104 is deposited around the fin-shaped silicon layer 103. As the first insulating film, an oxide film formed with high-density plasma or an oxide film formed by low-pressure CVD (Chemical Vapor Deposition) may be employed.

Figure 6A:
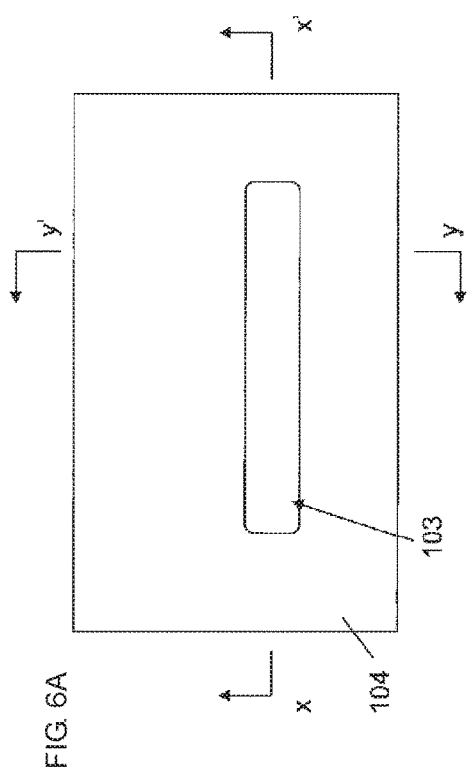
FIG. 6A is a plan view for explaining a method for producing a semiconductor device according to an embodiment of the present invention.
Figure 6C:
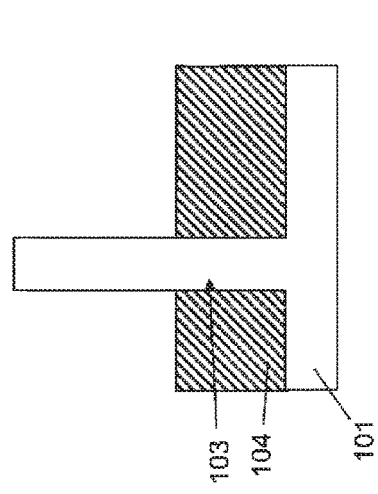
FIG. 6C is a sectional view taken along line y-y' in FIG. 6A.
Figure 6B:
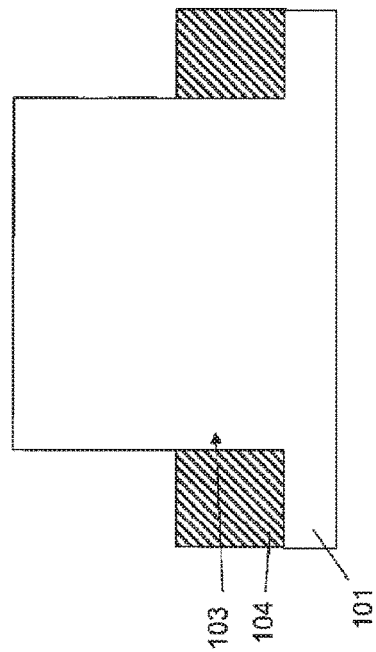
FIG. 6B is a sectional view taken along line x-x' in FIG. 6A.

As illustrated in FIGS. 6A to 6C, the first insulating film 104 is subjected to etch back to expose the upper portion of the fin-shaped silicon layer 103. The procedures having been described are the same as the production method of a fin-shaped silicon layer described in IEDM2010 CC. Wu, et. al, 27.1.1-27.1.4.

Thus, the first step has been described, the first step including forming a fin-shaped semiconductor layer on a semiconductor substrate, and forming a first insulating film around the fin-shaped semiconductor layer.

Hereafter, a second step will be described, the second step including, after the first step, forming a second insulating film around the fin-shaped semiconductor layer, depositing a first polysilicon on the second insulating film and planarizing the first polysilicon, forming a second resist for forming a gate line and a pillar-shaped semiconductor layer, in a direction perpendicular to the direction of the fin-shaped semiconductor layer, and etching the first polysilicon, the second insulating film, and the fin-shaped semiconductor layer to form a pillar-shaped semiconductor layer and a first dummy gate formed of the first polysilicon.

As illustrated in FIGS. 7A to 7C, a second insulating film 105 is formed around the fin-shaped silicon layer 103. The second insulating film 105 is preferably a nitride film having a low selectivity ratio to silicon. Alternatively, an oxide film may be employed.

Figure 8A:
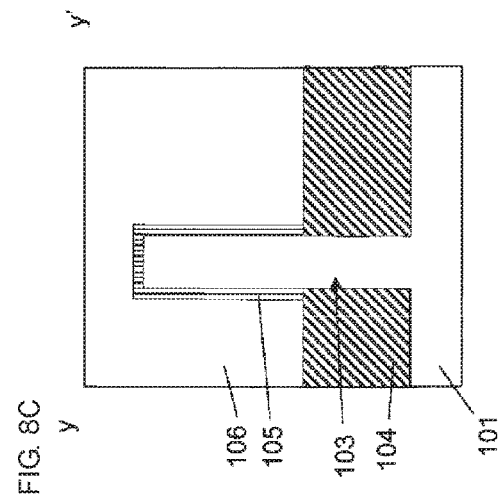
FIG. 8A is a plan view for explaining a method for producing a semiconductor device according to an embodiment of the present invention.
Figure 8B:
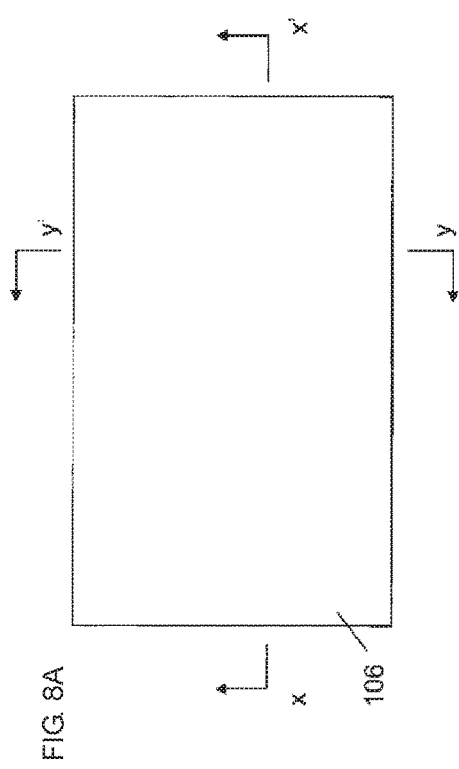
FIG. 8B is a sectional view taken along line x-x' in FIG. 8A.
Figure 8C:
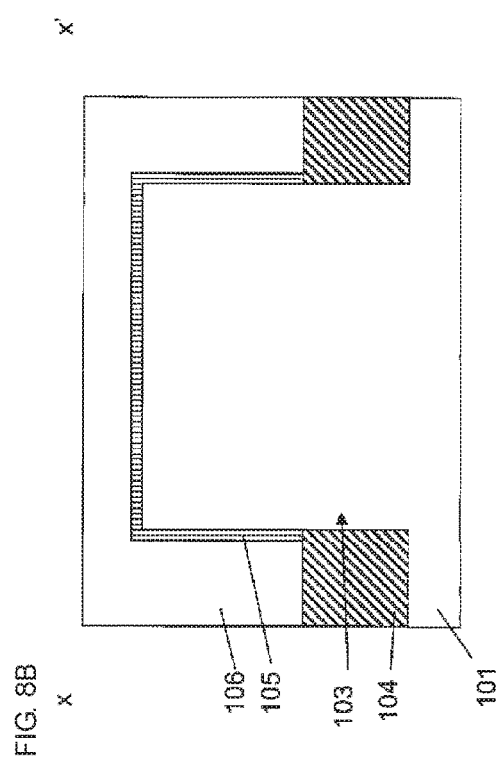
FIG. 8C is a sectional view taken along line y-y' in FIG. 8A.

As illustrated in FIGS. 8A to 8C, a first polysilicon 106 is deposited on the second insulating film 105 and planarized.

As illustrated in FIGS. 9A to 9C, a second resist 107 for forming a gate line and a pillar-shaped silicon layer is formed in the direction perpendicular to the direction of the fin-shaped silicon layer 103. Alternatively, a hard mask such as a nitride film or an oxide film may be employed.

As illustrated in FIGS. 10A to 10C, the first polysilicon 106, the second insulating film 105, and the fin-shaped silicon layer 103 are etched to form a pillar-shaped silicon layer 108 and a first dummy gate 106a formed from the first polysilicon.

As illustrated in FIGS. 11A to 11C, the second resist 107 is removed.

Thus, the second step has been described, the second step including, after the first step, forming a second insulating film around the fin-shaped semiconductor layer, depositing a first polysilicon on the second insulating film and planarizing the first polysilicon, forming a second resist for forming a gate line and a pillar-shaped semiconductor layer, in a direction perpendicular to the direction of the fin-shaped semiconductor layer, and etching the first polysilicon, the second insulating film, and the fin-shaped semiconductor layer to form a pillar-shaped semiconductor layer and a first dummy gate formed of the first polysilicon.

Hereafter, a third step will be described, the third step including, after the second step, forming a fourth insulating film around the pillar-shaped semiconductor layer and the first dummy gate, and forming a second dummy gate on side walls of the first dummy gate and the pillar-shaped semiconductor layer.

Figure 12A:
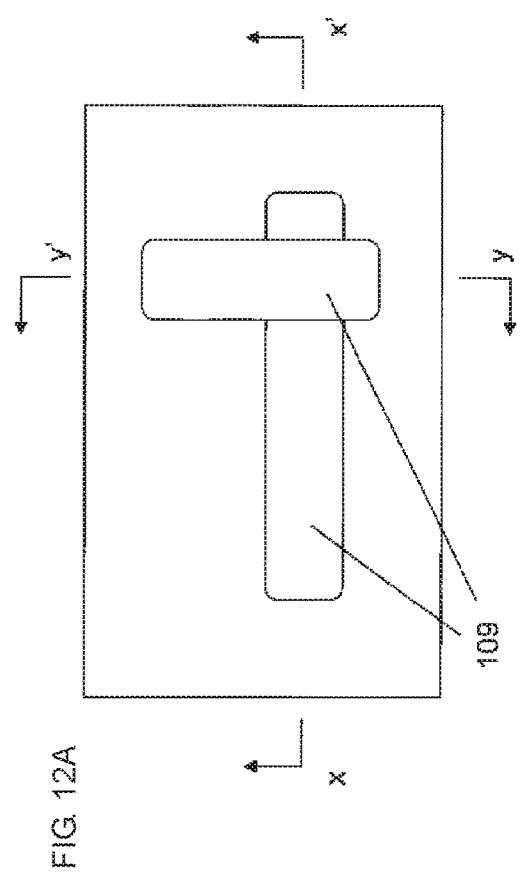
FIG. 12A is a plan view for explaining a method for producing a semiconductor device according to an embodiment of the present invention.
Figure 12C:
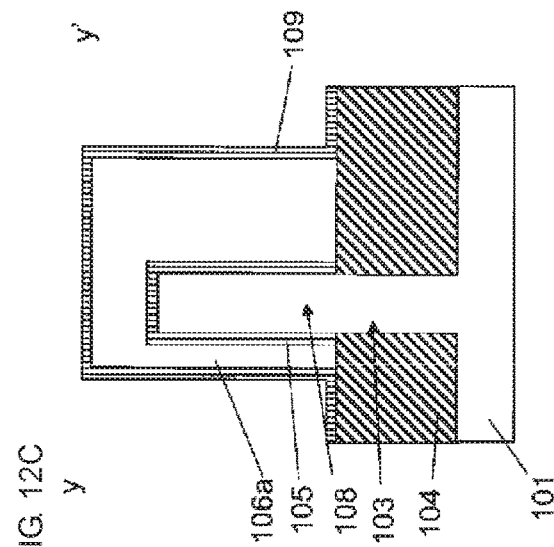
FIG. 12C is a sectional view taken along line y-y' in FIG. 12A.
Figure 12B:
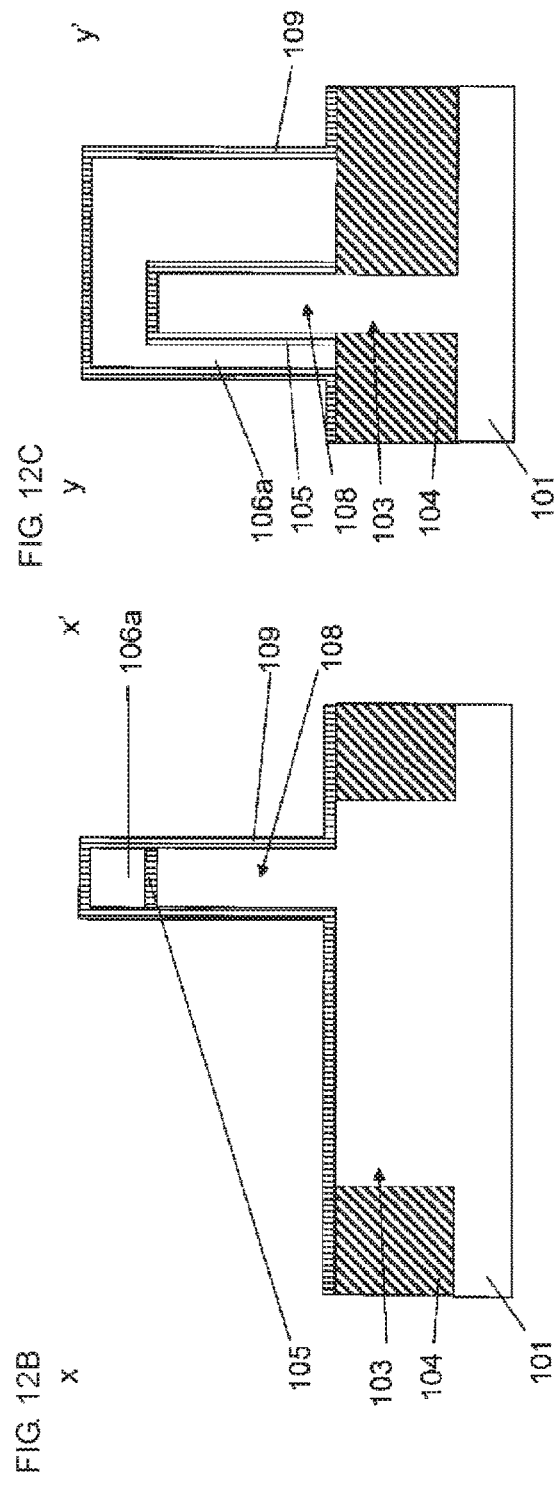
FIG. 12B is a sectional view taken along line x-x' in FIG. 12A.

As illustrated in FIGS. 12A to 12C, a fourth insulating film 109 is formed around the pillar-shaped silicon layer 108 and the first dummy gate 106a. The fourth insulating film 109 is preferably a nitride film. Alternatively, an oxide film may be employed.

As illustrated in FIGS. 13A to 13C, a second polysilicon 110 is deposited around the fourth insulating film 109.

As illustrated in FIGS. 14A to 14C, the second polysilicon 110 is etched so as to be left on the side walls of the first dummy gate 106a and the pillar-shaped silicon layer 108. Thus, a second dummy gate 110a is formed. At this time, the fourth insulating film 109 is also etched to be left as a fourth insulating film 109a.

Thus, the third step has been described, the third step including, after the second step, forming a fourth insulating film around the pillar-shaped semiconductor layer and the first dummy gate, and forming a second dummy gate on side walls of the first dummy gate and the pillar-shaped semiconductor layer.

Hereafter, a fourth step will be described, the fourth step including, after the third step, forming a fifth insulating film and a sixth insulating film around the second dummy gate.

As illustrated in FIGS. 15A to 15C, an impurity is introduced into an upper portion of the fin-shaped silicon layer 103 to form a second diffusion layer 111. A second diffusion layer 111 may also be formed in a lower portion of the pillar-shaped silicon layer 108. In the case of forming an n-type diffusion layer, arsenic or phosphorus is preferably introduced. In the case of forming a p-type diffusion layer, boron is preferably introduced. Alternatively, the second diffusion layer 111 may be formed before formation of a metal-semiconductor compound in an eighth step described later.

As illustrated in FIGS. 16A to 16C, a fifth insulating film 112 and a sixth insulating film 113 are formed around the second dummy gate. The fifth insulating film 112 is preferably an oxide film. The sixth insulating film 113 is preferably a nitride film. The fifth insulating film 112 and the sixth insulating film 113 may be the same insulating films. The fifth insulating film 112 and the sixth insulating film 113 may be formed before formation of the second diffusion layer 111 and etched so as to be left in sidewall shapes.

Thus, the fourth step has been described, the fourth step including, after the third step, forming a second diffusion layer in an upper portion of the fin-shaped semiconductor layer and a lower portion of the pillar-shaped semiconductor layer, and forming a fifth insulating film and a sixth insulating film around the second dummy gate.

Hereafter, a fifth step will be described, the fifth step including, after the fourth step, depositing a first interlayer insulating film, performing chemical mechanical polishing to expose upper portions of the second dummy gate and the first dummy gate, removing the second dummy gate and the first dummy gate, removing the second insulating film and the fourth insulating film, forming a gate insulating film around the pillar-shaped semiconductor layer, depositing metal, and performing etch back to form a gate electrode and a gate line.

As illustrated in FIGS. 17A to 17C, a first interlayer insulating film 114 is deposited.

As illustrated in FIGS. 18A to 18C, chemical mechanical polishing is performed to expose upper portions of the second dummy gate 110a and the first dummy gate 106a.

Figure 19A:
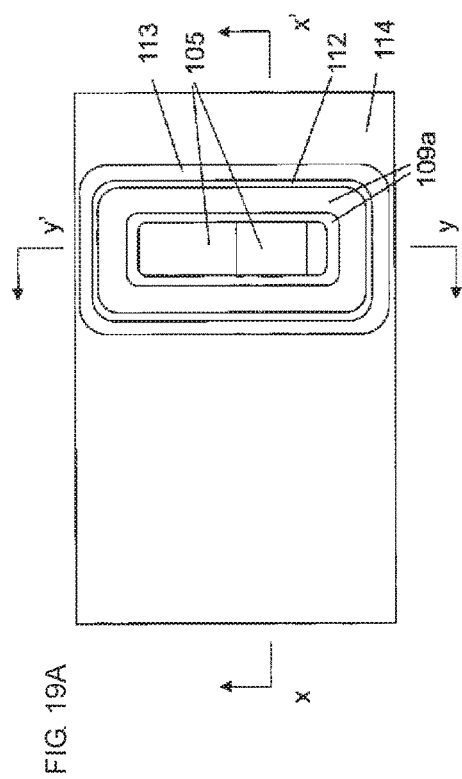
FIG. 19A is a plan view for explaining a method for producing a semiconductor device according to an embodiment of the present invention.
Figure 19C:
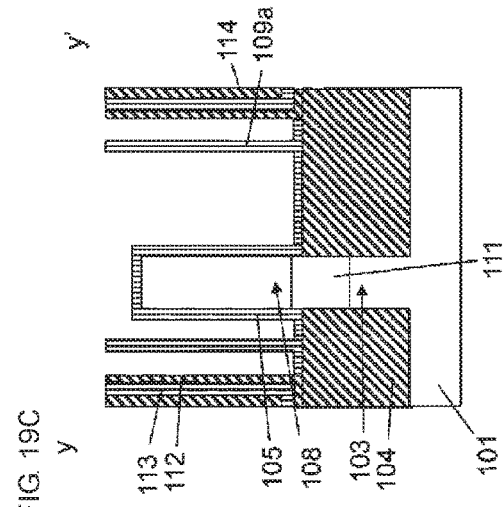
FIG. 19C is a sectional view taken along line y-y' in FIG. 19A.
Figure 19B:
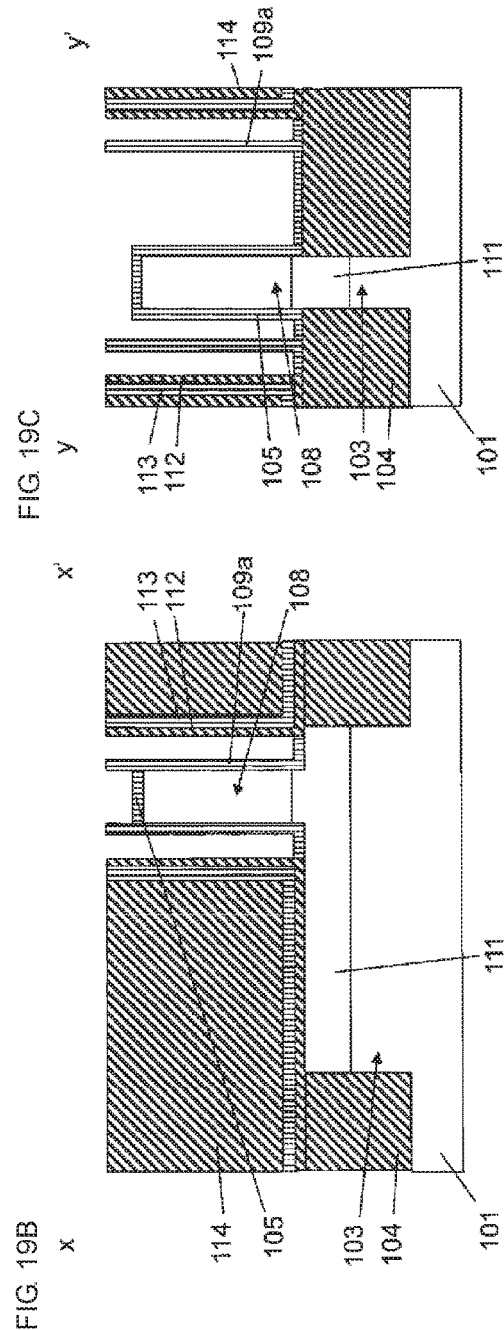
FIG. 19B is a sectional view taken along line x-x' in FIG. 19A.

As illustrated in FIGS. 19A to 19C, the second dummy gate 110a and the first dummy gate 106a are removed.

As illustrated in FIGS. 20A to 20C, the second insulating film 105 and the fourth insulating film 109a are removed.

As illustrated in FIGS. 21A to 21C, a gate insulating film 115 is formed around the pillar-shaped silicon layer 108. At this time, in the case of employing a high-K dielectric film as the deposition film, the gate insulating film 115 is formed also on the inner side of the fifth insulating film 112. The gate insulating film 115 is preferably a high-K dielectric film. Alternatively, the gate insulating film may be an oxide film, an oxynitride film, or a nitride film.

As illustrated in FIGS. 22A to 22C, a metal 116 is deposited. Since the metal gate is heat-treated at 900° C. or higher, the metal 116 is preferably a metal that is heat-treated to have a work function of about 4.6 eV, which corresponds to the midgap of silicon. For example, the metal 116 is preferably titanium nitride.

As illustrated in FIGS. 23A to 23C, the metal 116 is subjected to etch back to expose the upper portion of the pillar-shaped silicon layer 108. Thus, a gate electrode 116a is formed around the pillar-shaped silicon layer 108. Also, a gate line 116b is formed. In the case of employing a deposition film as the gate insulating film 115, the gate insulating film 115 formed around and under the gate electrode 116a and the gate line 116b enables insulation of the gate electrode 116a and the gate line 116b from the pillar-shaped silicon layer 108 and the fin-shaped silicon layer 103.

Thus, the fifth step has been described, the fifth step including, after the fourth step, depositing a first interlayer insulating film, performing chemical mechanical polishing to expose upper portions of the second dummy gate and the first dummy gate, removing the second dummy gate and the first dummy gate, removing the second insulating film and the fourth insulating film, forming a gate insulating film around the pillar-shaped semiconductor layer, depositing metal, and performing etch back to form a gate electrode and a gate line.

Hereafter, a sixth step will be described, the sixth step including, after the fifth step, forming a first diffusion layer in an upper portion of the pillar-shaped semiconductor layer.

As illustrated in FIGS. 24A to 24C, an impurity is introduced into an upper portion of the pillar-shaped silicon layer 108 to form a first diffusion layer 117. In the case of forming an n-type diffusion layer, arsenic or phosphorus is preferably introduced. In the case of forming a p-type diffusion layer, boron is preferably introduced. A heat treatment at 900° C. or higher is preferably performed. Alternatively, the heat treatment may be performed before formation of a metal-semiconductor compound in an eighth step described later.

Thus, the sixth step has been described, the sixth step including, after the fifth step, forming a first diffusion layer in an upper portion of the pillar-shaped semiconductor layer.

Hereafter, a seventh step will be described, the seventh step including, after the sixth step, forming a seventh insulating film on the gate electrode and the gate line.

As illustrated in FIGS. 25A to 25C, a seventh insulating film 118 is deposited on the gate electrode 116a and the gate line 116b. The seventh insulating film 118 is preferably a nitride film. Alternatively, the seventh insulating film 118 may be an oxide film. Alternatively, the seventh insulating film 118 may have a multilayer structure of an oxide film and a nitride film.

As illustrated in FIGS. 26A to 26C, the seventh insulating film 118 is subjected to etch back so as to be left as the seventh insulating film 118 on the gate electrode 116a and the gate line 116b.

Thus, the seventh step has been described, the seventh step including, after the sixth step, forming a seventh insulating film on the gate electrode and the gate line.

Hereafter, an eighth step will be described, the eighth step including, after the seventh step, removing the first interlayer insulating film, etching the fifth insulating film and the sixth insulating film to form insulating film sidewalls from the fifth insulating film and the sixth insulating film, and forming a metal-semiconductor compound on the second diffusion layer.

As illustrated in FIGS. 27A to 27C, the exposed gate insulating film 115 is removed.

Figure 28C:
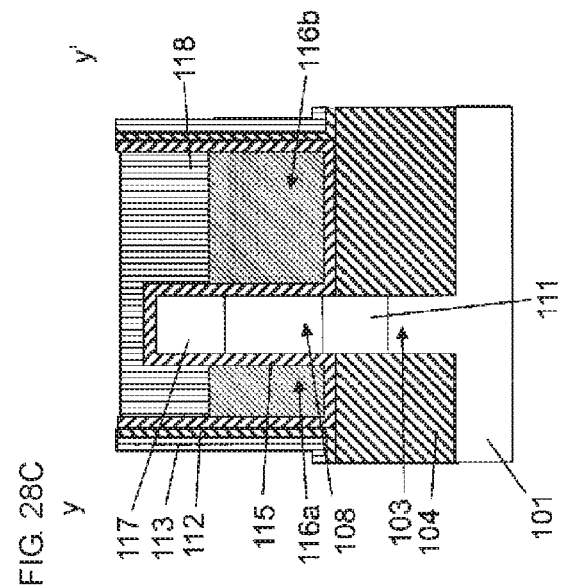
FIG. 28C is a sectional view taken along line y-y' in FIG. 28A.
Figure 28A:
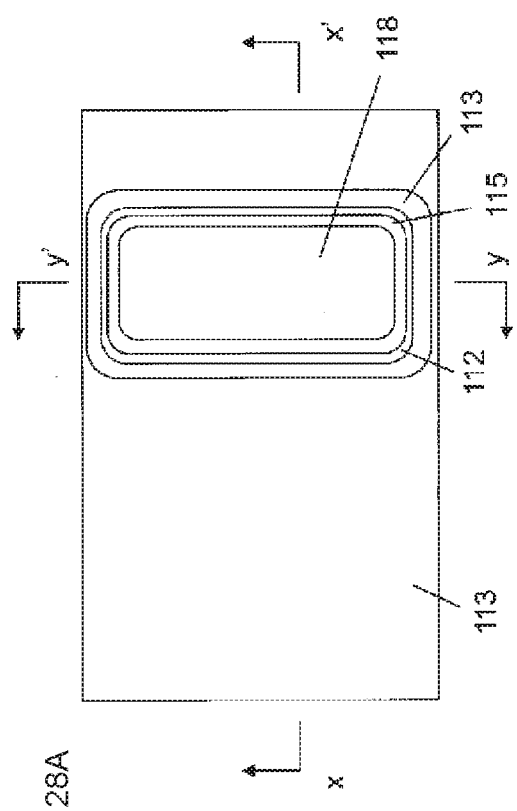
FIG. 28A is a plan view for explaining a method for producing a semiconductor device according to an embodiment of the present invention.
Figure 28B:
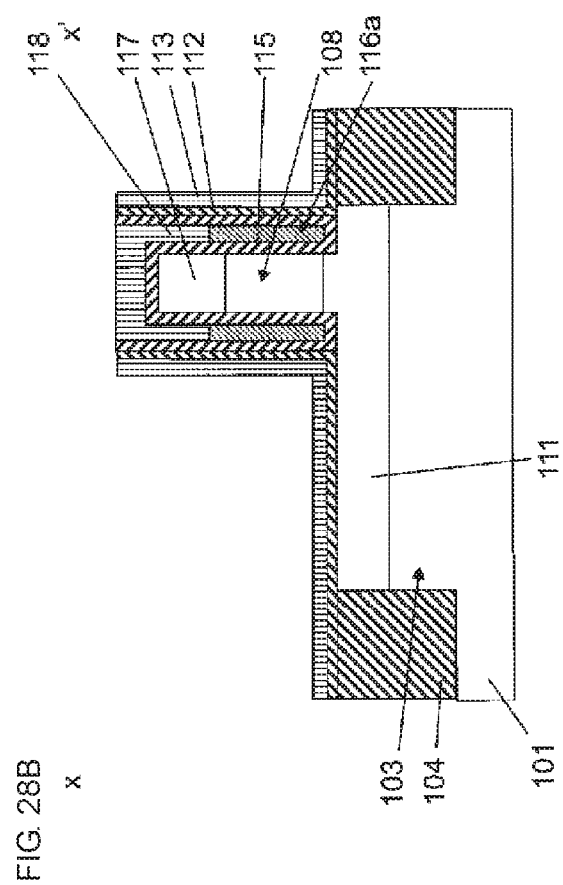
FIG. 28B is a sectional view taken along line x-x' in FIG. 28A.

As illustrated in FIGS. 28A to 28C, the first interlayer insulating film 114 is removed.

As illustrated in FIGS. 29A to 29C, the fifth insulating film 112 and the sixth insulating film 113 are etched to form insulating film sidewalls 112a and 113a formed from the fifth insulating film and the sixth insulating film.

Figure 30A:
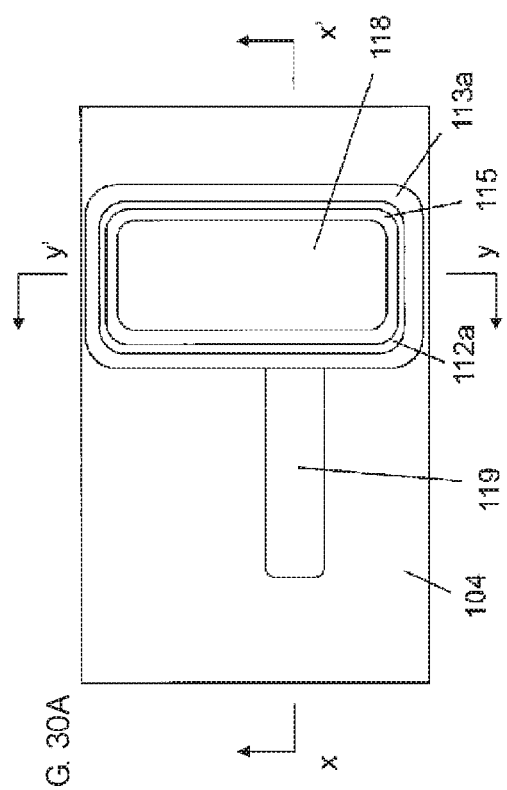
FIG. 30A is a plan view for explaining a method for producing a semiconductor device according to an embodiment of the present invention.
Figure 30C:
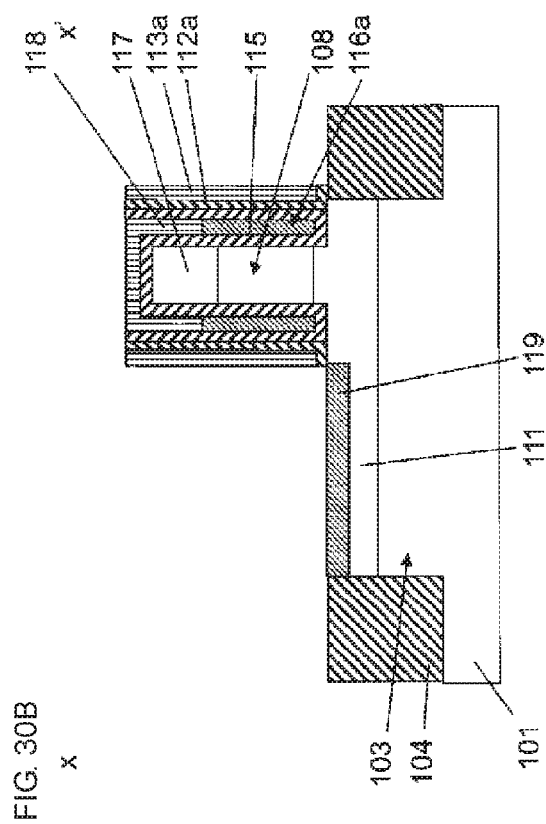
FIG. 30C is a sectional view taken along line y-y' in FIG. 30A.
Figure 30B:
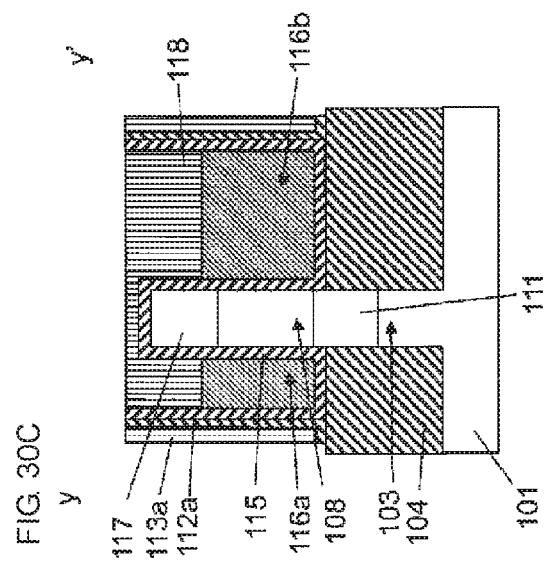
FIG. 30B is a sectional view taken along line x-x' in FIG. 30A.

As illustrated in FIGS. 30A to 30C, a metal-semiconductor compound 119 is formed on the second diffusion layer.

Thus, the eighth step has been described, the eighth step including, after the seventh step, removing the first interlayer insulating film, etching the fifth insulating film and the sixth insulating film to form insulating film sidewalls from the fifth insulating film and the sixth insulating film, and forming a metal-semiconductor compound on the second diffusion layer.

Hereafter, formation of contacts and formation of metal wires will be described.

Figure 31A:
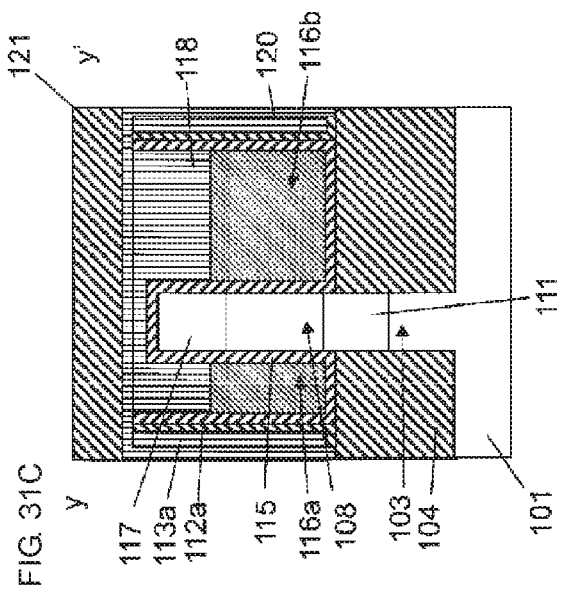
FIG. 31A is a plan view for explaining a method for producing a semiconductor device according to an embodiment of the present invention.
Figure 31B:
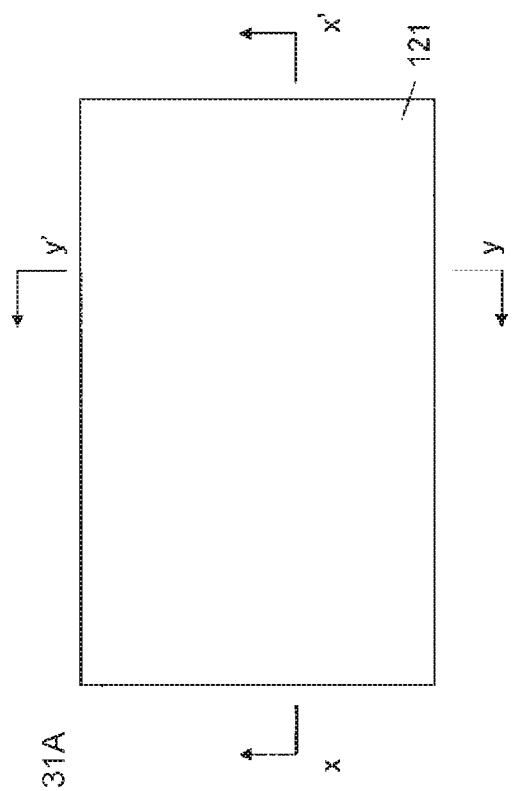
FIG. 31B is a sectional view taken along line x-x' in FIG. 31A.
Figure 31C:
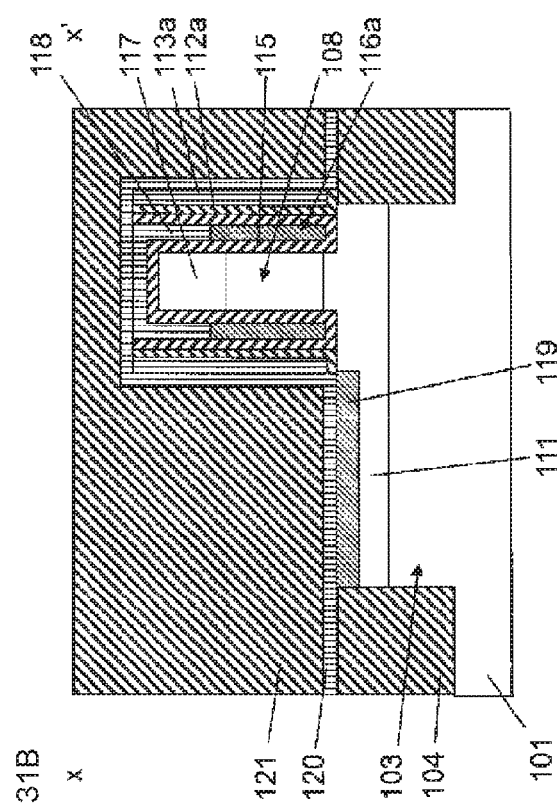
FIG. 31C is a sectional view taken along line y-y' in FIG. 31A.

As illustrated in FIGS. 31A to 31C, a contact stopper 120 is formed and a second interlayer insulating film 121 is formed. Formation of the contact stopper 120 may be omitted.

As illustrated in FIGS. 32A to 32C, a third resist 122 for forming a contact is formed.

As illustrated in FIGS. 33A to 33C, the second interlayer insulating film 121 is etched to form a contact hole 123.

As illustrated in FIGS. 34A to 34C, the third resist 122 is removed.

As illustrated in FIGS. 35A to 35C, a fourth resist 124 for forming a contact is formed.

Figure 36A:
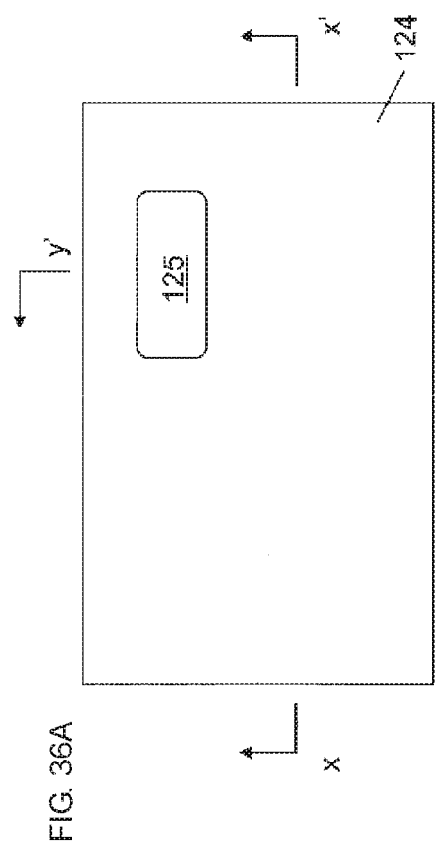
FIG. 36A is a plan view for explaining a method for producing a semiconductor device according to an embodiment of the present invention.
Figure 36B:
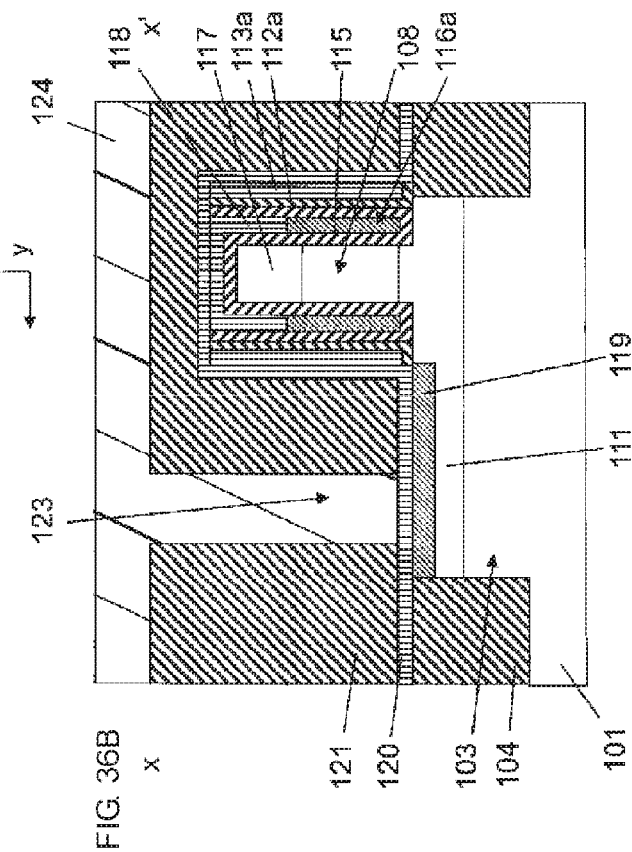
FIG. 36B is a sectional view taken along line x-x' in FIG. 36A.
Figure 36C:
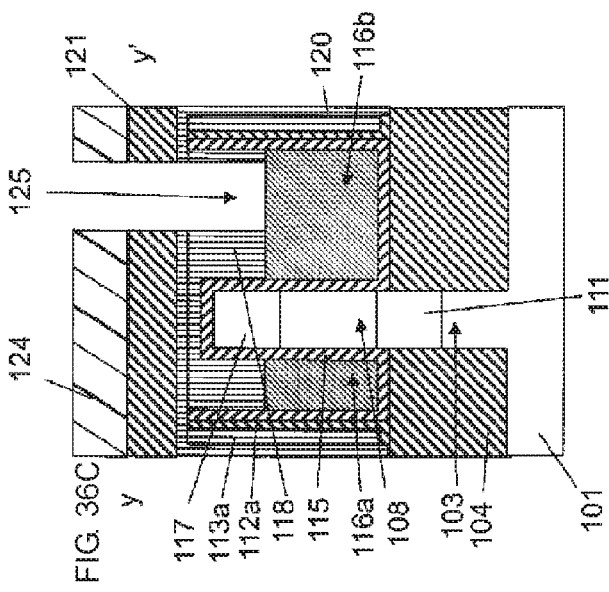
FIG. 36C is a sectional view taken along line y-y' in FIG. 36A.

As illustrated in FIGS. 36A to 36C, the second interlayer insulating film 121, the contact stopper 120, and the seventh insulating film 118 are etched to form a contact hole 125.

As illustrated in FIGS. 37A to 37C, the fourth resist 124 is removed.

As illustrated in FIGS. 38A to 38C, a fifth resist 126 for forming a contact is formed.

As illustrated in FIGS. 39A to 39C, the second interlayer insulating film 121, the contact stopper 120, and the seventh insulating film 118 are etched to form a contact hole 127.

As illustrated in FIGS. 40A to 40C, the fifth resist 126 is removed.

As illustrated in FIGS. 41A to 41C, the contact stopper 120 below the contact hole 123 is removed.

As illustrated in FIGS. 42A to 42C, a metal 131 is deposited to form contacts 128, 129, and 130.

As illustrated in FIGS. 43A to 43C, sixth resists 132, 133, and 134 for forming metal wires are formed.

As illustrated in FIGS. 44A to 44C, the metal 131 is etched to form metal wires 131a, 131b, and 131c.

As illustrated in FIGS. 45A to 45C, the sixth resists 132, 133, and 134 are removed.

Thus, the method for producing an SGT has been described in which two masks are used to form a fin-shaped semiconductor layer, a pillar-shaped semiconductor layer, a gate electrode, and a gate line, and a diffusion layer is formed so as to be self-aligned with the gate.

FIGS. 1A to 1C illustrate the structure of the semiconductor device obtained by the above-described production method.

The semiconductor device includes a fin-shaped silicon layer 103 formed on a silicon substrate 101; a first insulating film 104 formed around the fin-shaped silicon layer 103; a pillar-shaped silicon layer 108 formed on the fin-shaped silicon layer 103; a gate insulating film 115 formed around the pillar-shaped silicon layer 108; a gate electrode 116a formed around the gate insulating film 115 and formed of metal; a gate line 116b connected to the gate electrode 116a, formed of metal, and extending in a direction perpendicular to the fin-shaped silicon layer 103; a first diffusion layer 117 formed in an upper portion of the pillar-shaped silicon layer 108; a second diffusion layer 111 formed in an upper portion of the fin-shaped silicon layer 103; a silicon-metal compound layer 119 formed on the second diffusion layer 111; and a contact 129 directly connected to the first diffusion layer 117. The gate electrode 116a and the gate line 116b are heat-treated at 900° C. or higher.

The semiconductor device includes the second diffusion layer 111 formed in a lower portion of the pillar-shaped silicon layer 108, and the gate insulating film 115 formed around and under the gate electrode 116a and the gate line 116b. The width of the pillar-shaped silicon layer 108 is equal to the width of the fin-shaped silicon layer 103. The outer width of the gate electrode 116a is equal to the width of the gate line 116b.

Since the pillar-shaped silicon layer 108 and the gate line 116b are formed in a self-alignment manner, misalignment therebetween can be eliminated.

In addition, the gate insulating film 115 formed around and under the gate electrode 116a and the gate line 116b enables insulation of the gate electrode 116a and the gate line 116b from the pillar-shaped silicon layer 108 and the fin-shaped silicon layer 103.

Note that the present invention encompasses various embodiments and modifications without departing from the broad spirit and scope of the present invention. The above-described embodiments are used to describe examples of the present invention and do not limit the scope of the present invention.

For example, a method for producing a semiconductor device in which the p-type (including $p^+$ type) and the n-type (including $n^+$ type) in the above-described embodiment are changed to the opposite conductivity types and a semiconductor device produced by this method are obviously within the technical scope of the present invention.

The invention claimed is:

1. A method for producing a semiconductor device, the method comprising:

a first step of forming a fin-shaped semiconductor layer on a semiconductor substrate, forming a first insulating film around the fin-shaped semiconductor layer, and etching the first insulating film to expose an upper portion of the fin-shaped semiconductor layer;

a second step of, after the first step, forming a second insulating film around the upper portion of the fin-shaped semiconductor layer, depositing a first polysilicon on the second insulating film and planarizing the first polysilicon, forming a second resist for forming a gate line and a pillar-shaped semiconductor layer, in a direction perpendicular to a direction of the fin-shaped semiconductor layer, and etching the first polysilicon, the second insulating film, and the fin-shaped semiconductor layer to form a pillar-shaped semiconductor layer and a first dummy gate formed of the first polysilicon;

a third step of, after the second step, forming a fourth insulating film around the pillar-shaped semiconductor layer and the first dummy gate and forming a second dummy gate on side walls of the first dummy gate and the pillar-shaped semiconductor layer;

a fourth step of, after the third step, forming a fifth insulating film and a sixth insulating film around the second dummy gate;

a fifth step of, after the fourth step, depositing a first interlayer insulating film, performing chemical mechanical polishing to expose upper portions of the second dummy gate and the first dummy gate, removing the second dummy gate and the first dummy gate, removing the second insulating film and the fourth insulating film, forming a gate insulating film around the pillar-shaped semiconductor layer, depositing metal, and performing etch back to form a gate electrode and a gate line; and a sixth step of, after the fifth step, forming a first diffusion layer in an upper portion of the pillar-shaped semiconductor layer.

2. The method for producing a semiconductor device according to claim 1, further comprising a substep, after the third step, of forming a second diffusion layer in an upper portion of the fin-shaped semiconductor layer.

3. The method for producing a semiconductor device according to claim 1, further comprising a seventh step, after the sixth step, of forming a seventh insulating film on the gate electrode and the gate line.

4. The method for producing a semiconductor device according to claim 2, further comprising:

a seventh step, after the sixth step, of forming a seventh insulating film on the gate electrode and the gate line, and an eighth step, after the seventh step, of removing the first interlayer insulating film, etching the fifth insulating film and the sixth insulating film to form insulating film sidewalls from the fifth insulating film and the sixth insulating film, and forming a metal-semiconductor compound on the second diffusion layer.

5. A semiconductor device comprising:

a fin-shaped semiconductor layer formed on a semiconductor substrate;

a first insulating film formed around the fin-shaped semiconductor layer;

a pillar-shaped semiconductor layer formed on the fin-shaped semiconductor layer;

a gate insulating film formed around the pillar-shaped semiconductor layer;

a gate electrode formed around the gate insulating film and formed of metal;

a gate line connected to the gate electrode, formed of metal, and extending in a direction perpendicular to the fin-shaped semiconductor layer;

a first diffusion layer formed in an upper portion of the pillar-shaped semiconductor layer; and a second diffusion layer formed in an upper portion of the fin-shaped semiconductor layer, wherein the gate electrode and the gate line are surrounded and covered by the gate insulating film, a fifth insulating film that is an oxide film, and a sixth insulating film.

6. The semiconductor device according to claim 5, wherein:

the second diffusion layer is also formed in a lower portion of the pillar-shaped semiconductor layer; and the gate insulating film is formed around and under the gate electrode and the gate line; and a width of the pillar-shaped semiconductor layer is equal to a width of the fin-shaped semiconductor layer, and an outer width of the gate electrode is equal to a width of the gate line.

* * * * *